(12) United States Patent
Jeng et al.

(10) Patent No.: US 10,770,401 B2
(45) Date of Patent: Sep. 8, 2020

(54) METHOD FOR FORMING SEMICONDUCTOR DEVICE STRUCTURE WITH CONDUCTIVE LINE

(71) Applicant: Taiwan Semiconductor Manufacturing Co., Ltd., Hsinchu (TW)

(72) Inventors: Chi-Cherng Jeng, Tainan (TW); Shyh-Wei Cheng, Zhudong Township, Hsinchu County (TW); Yun Chang, Hsinchu (TW); Chen-Chieh Chiang, Kaohsiung (TW); Jung-Chi Jeng, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/715,215

(22) Filed: Dec. 16, 2019

(65) Prior Publication Data

US 2020/0118932 A1 Apr. 16, 2020

Related U.S. Application Data

(62) Division of application No. 15/884,760, filed on Jan. 31, 2018, now Pat. No. 10,510,671.

(Continued)

(51) Int. Cl.
| | |
|---|---|
| *H01L 23/538* | (2006.01) |
| *H01L 21/50* | (2006.01) |
| *H01L 21/762* | (2006.01) |
| *H01L 21/768* | (2006.01) |
| *H01L 23/00* | (2006.01) |

(Continued)

(52) U.S. Cl.
CPC .......... *H01L 23/5386* (2013.01); *H01L 21/50* (2013.01); *H01L 21/762* (2013.01); *H01L 21/76811* (2013.01); *H01L 21/76843* (2013.01); *H01L 21/76877* (2013.01); *H01L 23/481* (2013.01); *H01L 23/5226* (2013.01);
(Continued)

(58) Field of Classification Search
CPC .... H01L 23/5386; H01L 21/50; H01L 21/762
See application file for complete search history.

(56) References Cited

U.S. PATENT DOCUMENTS

| | | |
|---|---|---|
| 2003/0044725 A1 | 3/2003 | Hsue et al. |
| 2004/0219707 A1 | 11/2004 | Lee |
| 2009/0001341 A1 | 1/2009 | Breitwisch et al. |

OTHER PUBLICATIONS

U.S. Appl. No. 15/633,992, filed Jun. 27, 2017, Wu.

*Primary Examiner* — Errol V Fernandes
(74) *Attorney, Agent, or Firm* — Birch, Stewart, Kolasch & Birch, LLP

(57) ABSTRACT

A method for forming a semiconductor device structure is provided. The method includes forming a first mask layer over a dielectric layer. The method includes forming a second mask layer over a first top surface of the first mask layer, the inner wall, and the bottom surface. The method includes removing the second mask layer covering the bottom surface to form a second trench in the second mask layer. The method includes forming an anti-bombardment layer over a second top surface of the second mask layer. The second mask layer and the anti-bombardment layer are made of different materials. The method includes removing the first portion, the first mask layer, the second mask layer, and the anti-bombardment layer to form a third trench in the dielectric layer. The method includes forming a conductive structure in the third trench.

20 Claims, 15 Drawing Sheets

Related U.S. Application Data

(60) Provisional application No. 62/583,121, filed on Nov. 8, 2017.

(51) Int. Cl.
 *H01L 23/522* (2006.01)
 *H01L 23/48* (2006.01)

(52) U.S. Cl.
 CPC .......... *H01L 23/5384* (2013.01); *H01L 24/19* (2013.01); *H01L 24/20* (2013.01)

METHOD FOR FORMING SEMICONDUCTOR DEVICE STRUCTURE WITH CONDUCTIVE LINE

PRIORITY CLAIM AND CROSS-REFERENCE

This Application claims the benefit of U.S. Provisional Application No. 62/583,121, filed on Nov. 8, 2017, the entirety of which is incorporated by reference herein.

This application is a Divisional of U.S. application Ser. No. 15/884,760, filed on Jan. 31, 2018, the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes (e.g., line widths) continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

Figure 1A:
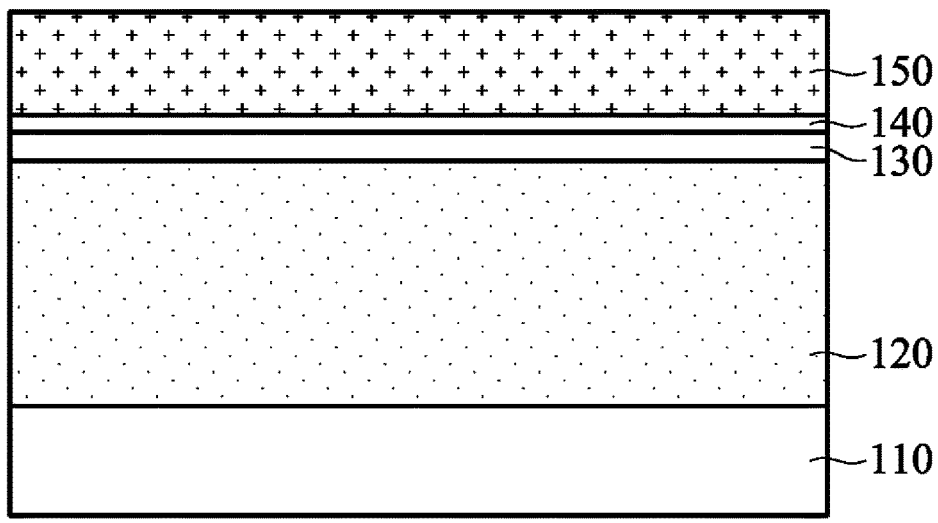
FIGS. 1A-1M are cross-sectional views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

FIGS. 1A-1M are cross-sectional views of various stages of a process for forming a semiconductor device structure, in accordance with some embodiments. As shown in FIG. 1A, a semiconductor substrate 110 is provided. In some embodiments, the semiconductor substrate 110 is a bulk semiconductor substrate, such as a semiconductor wafer. For example, the semiconductor substrate 110 is a silicon wafer.

The semiconductor substrate 110 may include silicon or another elementary semiconductor material such as germanium. In some other embodiments, the semiconductor substrate 110 includes a compound semiconductor. The compound semiconductor may include silicon germanium, gallium arsenide, silicon carbide, indium arsenide, indium phosphide, another suitable compound semiconductor, or a combination thereof.

In some embodiments, the semiconductor substrate 110 includes a semiconductor-on-insulator (SOI) substrate. The SOI substrate may be fabricated using a wafer bonding process, a silicon film transfer process, a separation by implantation of oxygen (SIMOX) process, another applicable method, or a combination thereof.

In some embodiments, various device elements are formed in and/or over the semiconductor substrate 110. The device elements are not shown in figures for the purpose of simplicity and clarity. Examples of the various device elements include transistors, diodes, another suitable element, or a combination thereof.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc. Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the semiconductor substrate 110. The isolation features are used to define active regions and electrically isolate various device elements formed in and/or over the semiconductor substrate 110 in the active regions. In some embodiments, the isolation features include shallow trench isolation (STI) features, local oxidation of silicon (LOCOS) features, other suitable isolation features, or a combination thereof.

In some embodiments, an interconnection structure (not shown) is formed over the semiconductor substrate 110 in regions 110A and 110B. The regions 110A and 110B may be referred to as a narrow line width region and a wide line width region, but embodiments of the disclosure are not limited thereto.

The interconnection structure includes multiple dielectric layers containing an interlayer dielectric (ILD) layer and one or more inter-metal dielectric (IMD) layers. The interconnection structure also includes multiple conductive features formed in the ILD and IMD layers. The conductive features may include conductive lines, conductive vias, and/or conductive contacts. Various processes, such as back-end-of-line (BEOL) semiconductor fabrication processes, are performed to form the interconnection structure.

Various device elements are interconnected through the interconnection structure over the semiconductor substrate 110 to form integrated circuit devices. The integrated circuit devices include logic devices, memory devices (e.g., static random access memories, SRAMs), radio frequency (RF) devices, input/output (I/O) devices, system-on-chip (SoC) devices, image sensor devices, other applicable types of devices, or a combination thereof.

As shown in FIG. 1A, a dielectric layer 120 is deposited over the semiconductor substrate 110 in the regions 110A and 110B. The dielectric layer 120 may serve as an ILD or IMD layer of an interconnection structure. The dielectric layer 120 covers device elements formed in and/or over the semiconductor substrate 110. Although FIG. 1A shows that the dielectric layer 120 is a single layer, embodiments of the disclosure are not limited thereto. In some other embodiments, the dielectric layer 120 is a multi-layer structure including dielectric sub-layers (not shown).

In some embodiments, the dielectric layer 120 is made of or includes an insulating material, such as silicon oxide, silicon oxynitride, a low dielectric constant (low-k) material, an extreme low-k (ELK) material, borosilicate glass (BSG), phosphoric silicate glass (PSG), borophosphosilicate glass (BPSG), fluorinated silicate glass (FSG), one or more other suitable materials, or a combination thereof. In some embodiments, the dielectric layer 120 is deposited using a chemical vapor deposition (CVD) process, an atomic layer deposition (ALD) process, a spin-on process, a spray coating process, one or more other applicable processes, or a combination thereof.

The low-k or ELK material may have a smaller dielectric constant than that of silicon dioxide. For example, the low-k material may have a dielectric constant in a range from about 1.5 to about 3.5. The ELK material may have a dielectric constant, which is less than about 2.5 or in a range from about 1.5 to about 2.5. As the density of semiconductor devices increases and the size of circuit elements becomes smaller, the resistance capacitance (RC) delay time increasingly dominates circuit performance. Therefore, using a low-k or ELK material as the dielectric layer 120 is helpful in reducing the RC delay.

A wide variety of low-k or ELK material may be used for forming the dielectric layer 120. In some embodiments, the dielectric layer 120 is made of or includes a porous dielectric material, an organic polymer, an organic silica glass, SiOF series material, a hydrogen silsesquioxane (HSQ) series material, a methyl silsesquioxane (MSQ) series material, carbon doped silicon oxide, amorphous fluorinated carbon, parylene, benzocyclobutenes (BCB), polytetrafluoroethylene (PTFE) (Teflon), silicon oxycarbide polymers (SiOC), a porous organic series material, a spin-on inorganic dielectric, a spin-on organic dielectric material, one or more other suitable materials, or a combination thereof.

Multiple conductive features (not shown) are formed in the dielectric layer 120 in the regions 110A and 110B. The conductive features may be electrically connected to gate structures or power devices formed on the semiconductor substrate 110 or doped regions formed in the semiconductor substrate 110. The conductive features in the region 110A may be electrically connected to the gate structures and the doped regions, and the conductive features in the region 110B may be electrically connected to the power devices.

The conductive features may include conductive lines, conductive vias, conductive contacts, or a combination thereof. In some embodiments, the conductive features are made of or include a conductive material, such as a metal material (e.g., copper, aluminum, tungsten, titanium, cobalt, nickel, gold, platinum, or a combination thereof). Various processes, including deposition, etching, planarization, or the like, may be used to form the conductive features in the dielectric layer 120.

As shown in FIG. 1A, a mask layer 130 is deposited over the dielectric layer 120, in accordance with some embodiments. The mask layer 130 is also referred to as an anti-reflective coating (ARC) layer, in accordance with some embodiments. The mask layer 130 may absorb light thereby minimizing reflection during a subsequent photolithography process so as to enhance the resolution of the photolithography process. In some embodiments, the mask layer 130 is made of or includes an anti-reflective material, such as SiON, SiCN, SiN, HfO, $Al_2O_3$, $Ta_2O_5$, ZrO, one or more other suitable materials, or a combination thereof.

In some embodiments, the mask layer 130 is a nitrogen-free anti-reflective coating (NFARC) layer. By keeping an interface between the dielectric layer 120 and the mask layer 130 nitrogen free, little or no nitrogen diffuses into the dielectric layer 120 so as to prevent contamination. The mask layer 130 is deposited using a spray coating process, a spin-on process, a CVD process, an ALD process, one or more other applicable processes, or a combination thereof.

As shown in FIG. 1A, a hard mask layer 140 is deposited over the mask layer 130. The hard mask layer 140 is made of or includes titanium nitride (TiN), SiON, one or more other suitable materials, or a combination thereof. In some other embodiments, the hard mask layer 140 is a multi-layer structure, such as oxide-nitride-oxide (ONO) layers. The hard mask layer 140 is deposited using a PVD process (such as a radio-frequency PVD (RFPVD) process), a CVD process, an ALD process, one or more other applicable processes, or a combination thereof.

As shown in FIG. 1A, a mask layer 150 is deposited over the hard mask layer 140, in accordance with some embodiments. The mask layer 150 is also referred to as an anti-reflective coating (ARC) layer, in accordance with some embodiments. The mask layer 150 is made of or includes an anti-reflective material, such as SiON, SiCN, SiN, HfO, $Al_2O_3$, $Ta_2O_5$, ZrO, one or more other suitable materials, or a combination thereof.

In some embodiments, the mask layer 150 and the mask layer 130 are made of or include the same material. In some embodiments, the dielectric layer 120 and the mask layer 150 are made of different materials. In some embodiments, the hard mask layer 140 and the mask layer 150 are made of different materials.

In some embodiments, the mask layer 150 is a nitrogen-free anti-reflective coating (NFARC) layer. The mask layer 150 is deposited using a spray coating process, a spin-on process, a CVD process, an ALD process, one or more other applicable processes, or a combination thereof.

Figure 1B:
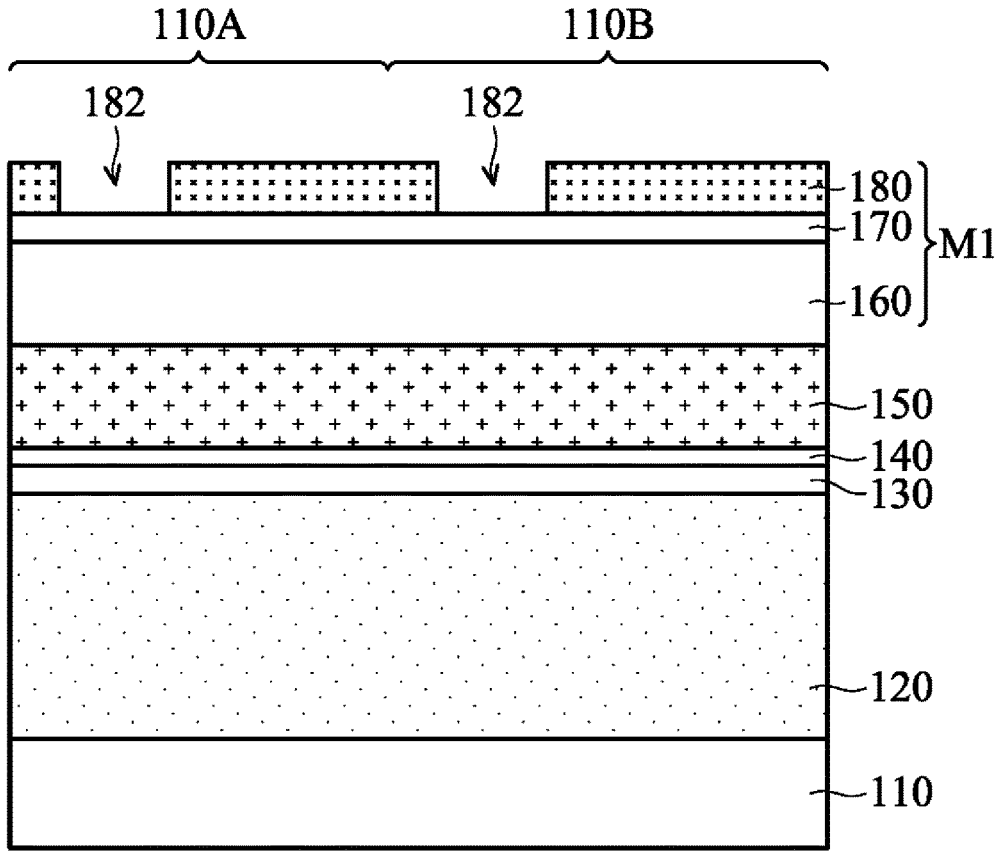

Afterwards, as shown in FIG. 1B, a patterned mask structure M1 is formed over the mask layer 150, in accordance with some embodiments. The patterned mask structure M1 is a multi-layer mask structure, in accordance with some embodiments. The patterned mask structure M1 includes a lower layer 160, a middle layer 170 and an upper layer 180, in accordance with some embodiments.

As shown in FIG. 1B, the lower layer 160, the middle layer 170 and the upper layer 180 are sequentially deposited over the mask layer 150, in accordance with some embodiments. In some embodiments, the lower layer 160 is made of or includes a polymer material. In some embodiments, the middle layer 170 is made of or includes a silicon-containing material, such as a silicon-containing polymer material. In some embodiments, the upper layer 180 is made of or includes a photoresist material. In some embodiments, the lower layer 160, the middle layer 170 and the upper layer 180 are deposited using a PVD process, a CVD process, a spin-on process, another applicable process, or a combination thereof.

The upper layer 180 is patterned to form trenches 182 in the upper layer 180, in accordance with some embodiments. The trenches 182 partially expose the middle layer 170. The upper layer 180 is patterned by a photolithography process. Afterwards, the middle layer 170 is patterned or etched using the patterned upper layer 180 as an etch mask. As a result, the trenches 182 are transferred into the middle layer 170 (not shown).

The patterned upper layer 180 may be removed during the patterning of the middle layer 170. Similarly, the lower layer 160 is then patterned or etched using the patterned middle layer 170 as an etch mask. As a result, the trenches 182 are transferred into the lower layer 160 (not shown). The patterned middle layer 170 may be removed during the patterning of the lower layer 160.

Figure 1C:
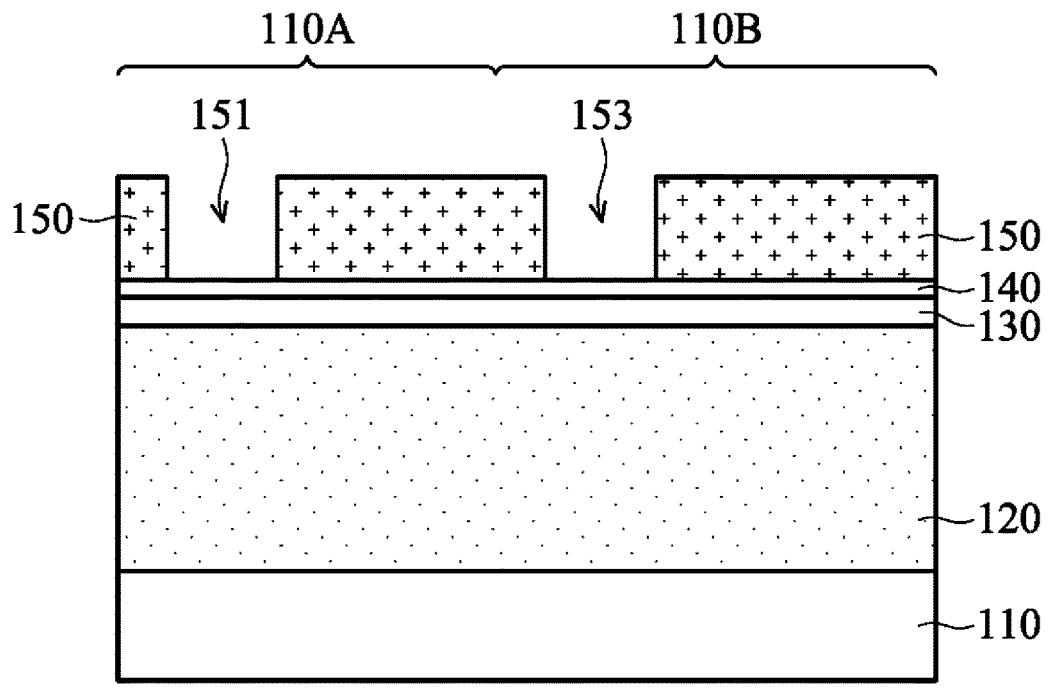

The patterned lower layer 160 is subsequently used as an etch mask to pattern the mask layer 150. As shown in FIG. 1C, the mask layer 150 is patterned or etched using the patterned lower layer 160 as an etch mask, in accordance with some embodiments. As a result, trenches 151 and 153 are formed in the mask layer 150, in accordance with some embodiments. The trenches 151 and 153 penetrate through the mask layer 150, in accordance with some embodiments. The trenches 151 and 153 partially expose the hard mask layer 140 thereunder, in accordance with some embodiments. The patterned lower layer 160 may be removed during the patterning of the mask layer 150.

In some embodiments, the middle layer 170, the lower layer 160, and the mask layer 150 are sequentially patterned using one or more etching processes. The etching process may be a dry etching process, one or more other applicable processes, or a combination thereof.

Figure 1D:
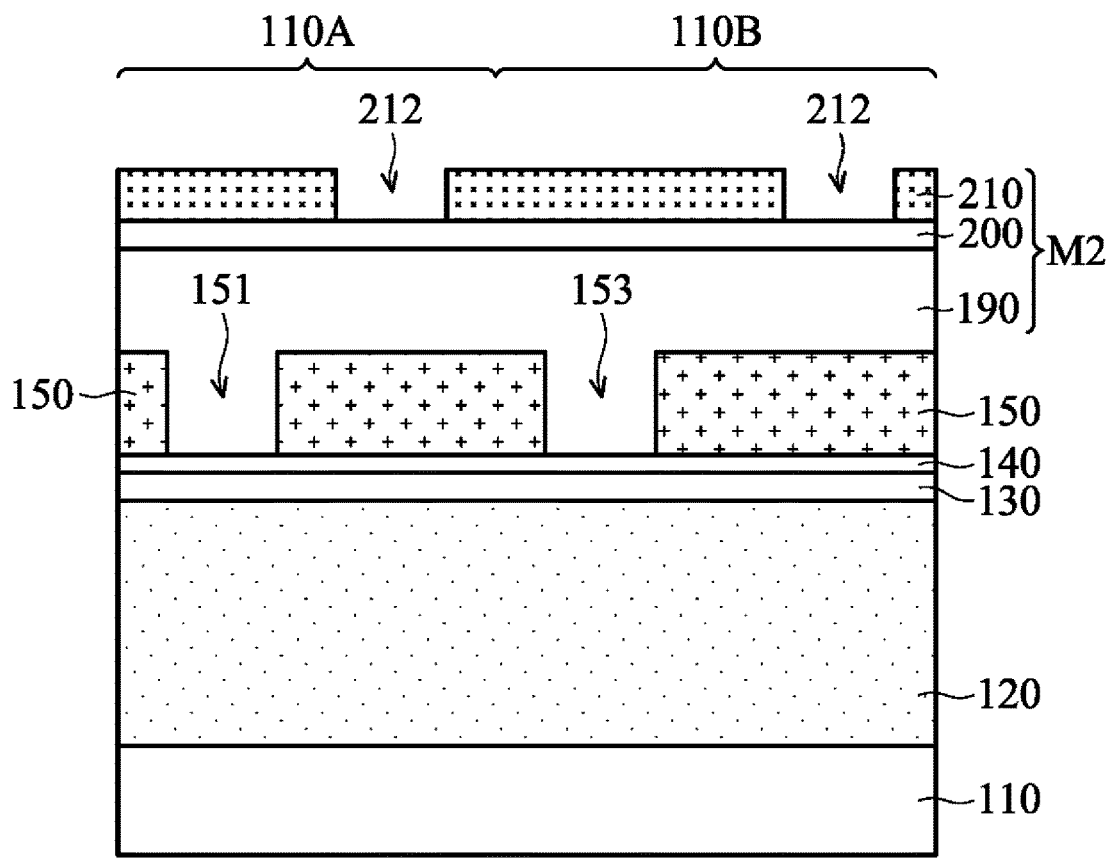

Afterwards, as shown in FIG. 1D, a patterned mask structure M2 is formed over the mask layer 150, in accordance with some embodiments. The patterned mask structure M2 is a multi-layer mask structure, in accordance with some embodiments. The patterned mask structure M2 includes a lower layer 190, a middle layer 200, and an upper layer 210, in accordance with some embodiments.

As shown in FIG. 1D, the lower layer 190, the middle layer 200, and the upper layer 210 are sequentially deposited over the mask layer 150, in accordance with some embodiments. In some embodiments, the lower layer 190 is made of or includes a polymer material. In some embodiments, the middle layer 200 is made of or includes a silicon-containing material, such as a silicon-containing polymer material. In some embodiments, the upper layer 210 is made of or includes a photoresist material. In some embodiments, the lower layer 190, the middle layer 200 and the upper layer 210 are deposited using a PVD process, a CVD process, a spin-on process, another applicable process, or a combination thereof.

The upper layer 210 is patterned to form trenches 212 in the upper layer 210, in accordance with some embodiments. The trenches 212 partially expose the middle layer 200. The upper layer 210 is patterned by a photolithography process.

Afterwards, the middle layer 200 is patterned or etched using the patterned upper layer 210 as an etch mask. As a result, the trenches 212 are transferred into the middle layer 200 (not shown). The patterned upper layer 210 may be removed during the patterning of the middle layer 200. Similarly, the lower layer 190 is then patterned or etched using the patterned middle layer 200 as an etch mask. As a result, the trenches 212 are transferred into the lower layer 190 (not shown). The patterned middle layer 200 may be removed during the patterning of the lower layer 190.

Figure 1E:
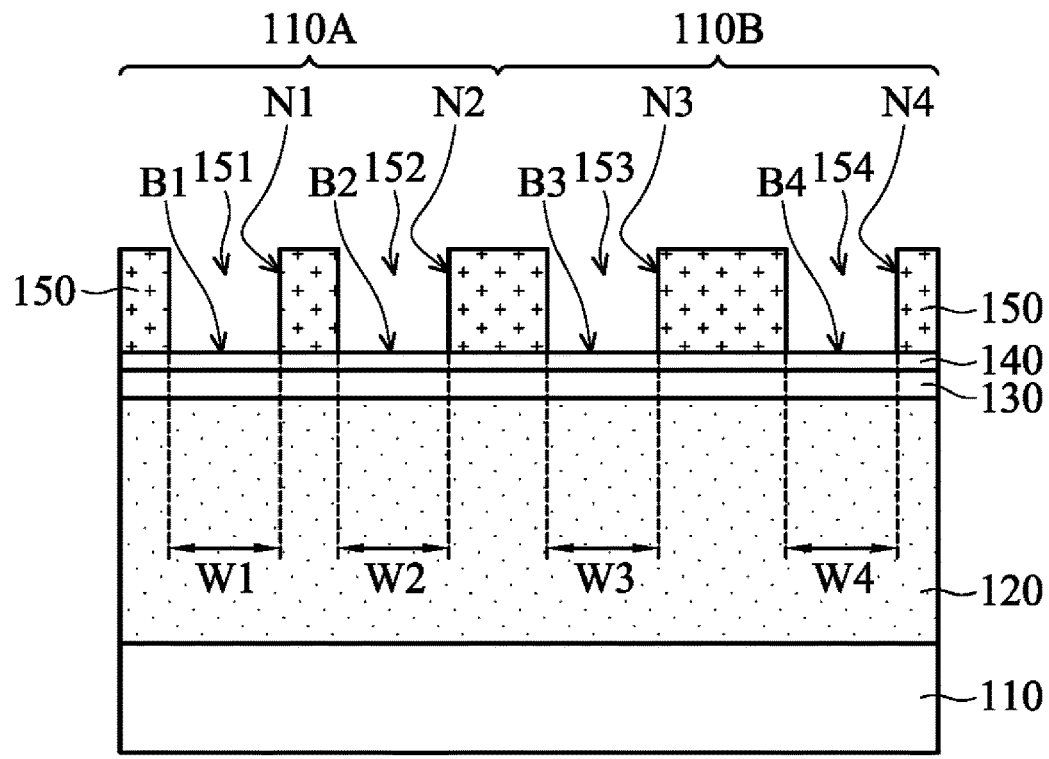

The patterned lower layer 190 is subsequently used as an etch mask to pattern the mask layer 150. As shown in FIG. 1E, the mask layer 150 is patterned and etched using the patterned lower layer 190 as an etch mask. As a result, trenches 152 and 154 are formed in the mask layer 150. The trenches 152 and 154 penetrate through the mask layer 150. The trenches 152 and 154 partially expose the hard mask layer 140 thereunder, in accordance with some embodiments. The patterned lower layer 190 may be removed during the patterning of the mask layer 150.

In some embodiments, the middle layer 200, the lower layer 190 and the mask layer 150 are sequentially patterned using one or more etching processes. The etching process may be a dry etching process, one or more other applicable processes, or a combination thereof.

Afterwards, as shown in FIG. 1E, the trenches 151, 152, 153, and 154 respectively have widths W1, W2, W3 and W4, in accordance with some embodiments. The widths W1, W2, W3 and W4 are substantially equal to each other, in accordance with some embodiments. The term "substantially equal to" means "within 10%", in accordance with some embodiments.

For example, the term "substantially equal to" means the difference between the widths W1, W2, W3 and W4 is within 10% of the average width of the trenches 151, 152, 153, and 154, in accordance with some embodiments. The trenches 151, 152, 153, and 154 have inner walls N1, N2, N3, and N4 and bottom surfaces B1, B2, B3 and B4, in accordance with some embodiments.

Figure 1F:
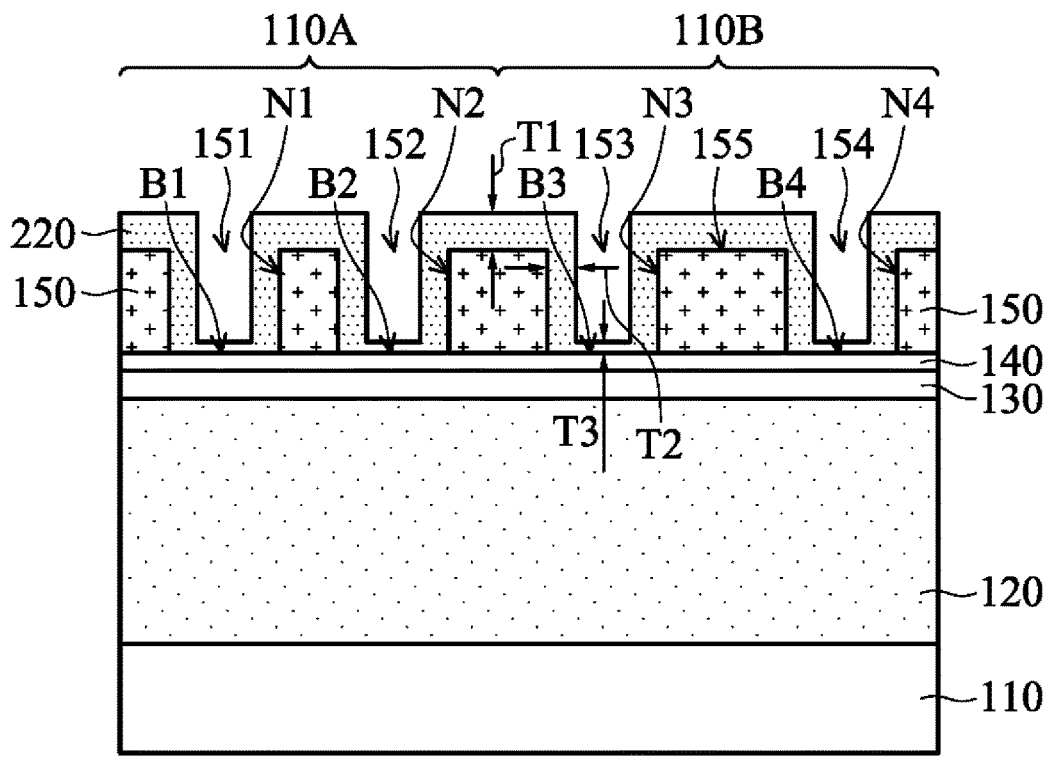

Thereafter, as shown in FIG. 1F, a mask layer 220 is deposited over the mask layer 150 and in the trenches 151, 152, 153, and 154, in accordance with some embodiments. The mask layer 220 conformally covers a top surface 155 of the mask layer 150, the inner walls N1, N2, N3, and N4, and the bottom surfaces B1, B2, B3 and B4, in accordance with some embodiments. The mask layer 220 is in direct contact with the mask layers 140 and 150, in accordance with some embodiments.

In some embodiments, a first thickness T1 of the mask layer 220 over the top surface 155 is greater than a second thickness T2 of the mask layer 220 over the inner walls N1, N2, N3, and N4. The second thickness T2 is greater than a third thickness T3 of the mask layer 220 over the bottom surfaces B1, B2, B3 and B4, in accordance with some embodiments.

The mask layer 220 is also referred to as an anti-reflective coating (ARC) layer, in accordance with some embodiments. The mask layer 220 is made of or includes an anti-reflective material, such as SiON, SiCN, SiN, HfO, $Al_2O_3$, $Ta_2O_5$, ZrO, one or more other suitable materials, or a combination thereof.

In some embodiments, the mask layer 220 and the mask layer 150 are made of or include the same material. In some embodiments, the mask layer 220 is a nitrogen-free anti-reflective coating (NFARC) layer. The mask layer 220 is deposited using a CVD process, an ALD process, one or more other applicable processes, or a combination thereof.

Figure 1G:
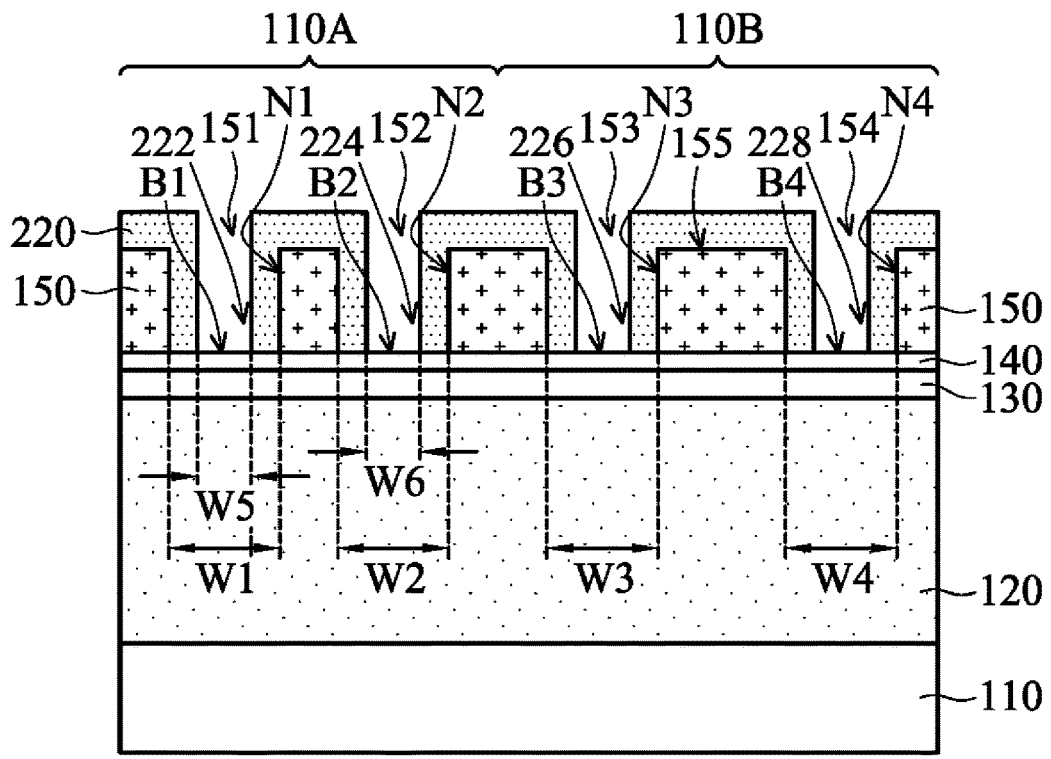

As shown in FIG. 1G, the mask layer 220 covering the bottom surfaces B1, B2, B3, and B4 is removed to form trenches 222, 224, 226, and 228 in the mask layer 220, in accordance with some embodiments. The trenches 222, 224, 226, and 228 respectively expose the bottom surfaces B1, B2, B3, and B4, in accordance with some embodiments.

The trenches 222 and 224 respectively have widths W5 and W6, in accordance with some embodiments. The width W5 or W6 is less than the width W1, W2, W3, or W4, in accordance with some embodiments. After the removal process, the remaining mask layer 220 covers the inner walls N1, N2, N3, and N4 and the top surface 155, in accordance with some embodiments. The removal process includes a dry etching process (e.g., an anisotropic etching process) or a wet etching process, in accordance with some embodiments. The dry etching process includes a plasma etching process, in accordance with some embodiments.

Figure 1H:
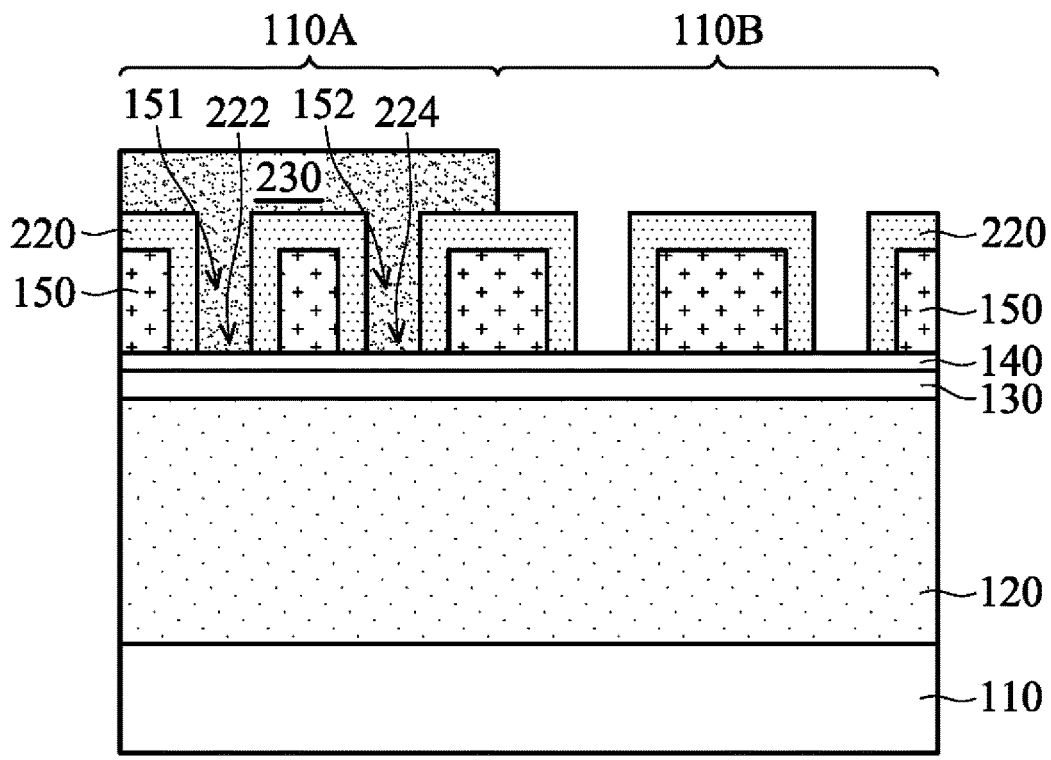
Figure 1I:
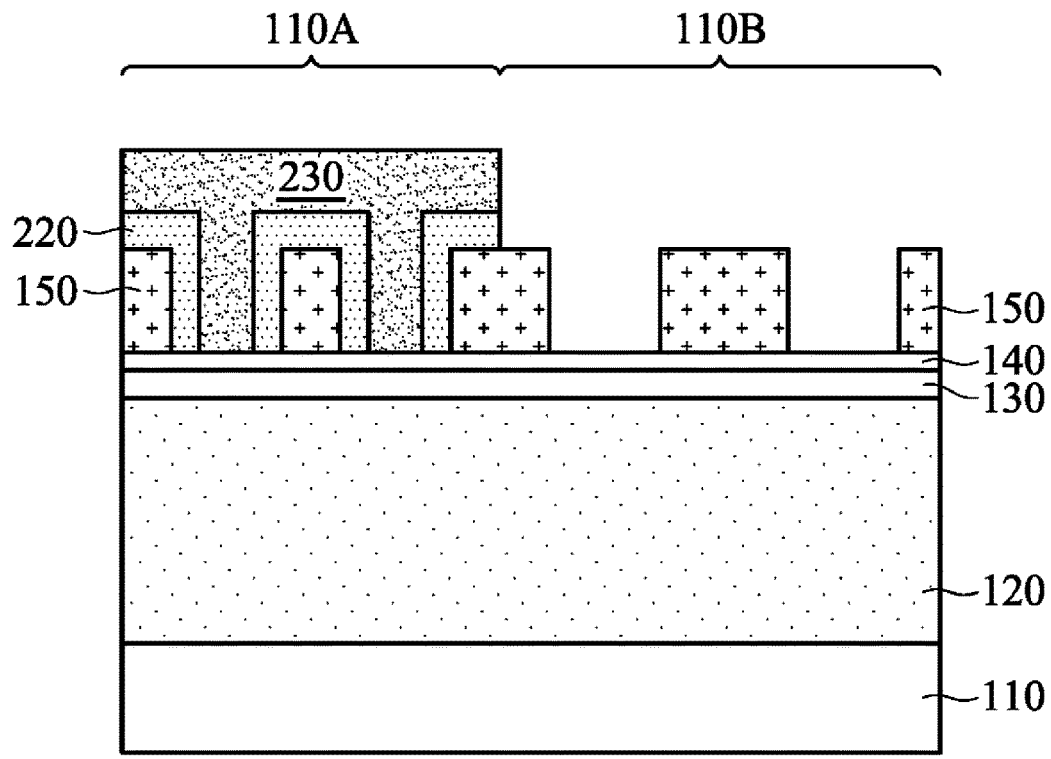

As shown in FIG. 1H, a photoresist layer 230 is formed over the mask layer 220 in the region 110A, in accordance with some embodiments. The photoresist layer 230 is filled in the trenches 151 and 152, in accordance with some embodiments. As shown in FIG. 1I, the mask layer 220 in the region 110B is removed, in accordance with some embodiments. The removal process includes an etching process, such as a dry etching process, in accordance with some embodiments.

Figure 1J:
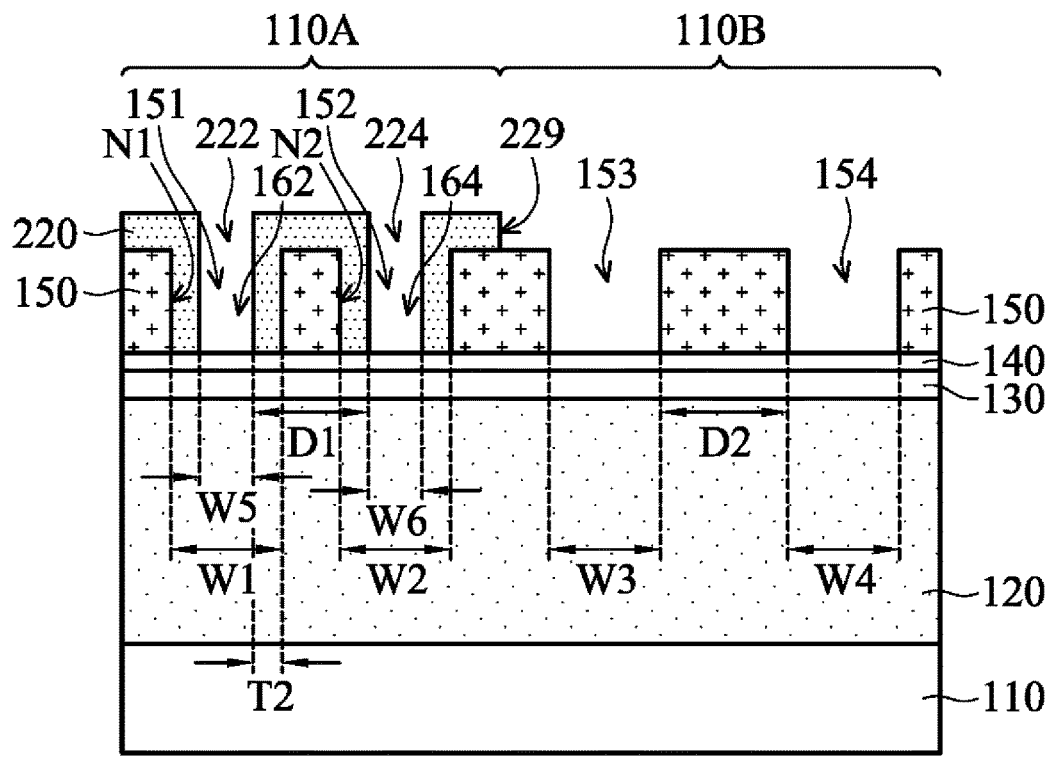

As shown in FIG. 1J, the photoresist layer 230 is removed, in accordance with some embodiments. The mask layer 220 has a sidewall 229 aligned with the boundary between the regions 110A and 110B, in accordance with some embodiments. In some embodiments, a ratio of the thickness T2 of the mask layer 220 over the inner wall N1 to the width W1 of the trench 151 ranges from about 0.16 to about 0.4. In some embodiments, a ratio of the width W5 of the trench 222 to the width W1 of the trench 151 ranges from about 0.16 to about 0.66. In some embodiments, a distance D1 between the trenches 222 and 224 is less than a distance D2 between the trenches 153 and 154.

The mask layers 150 and 220 are used as an etch mask in subsequent processes for forming conductive lines, in accordance with some embodiments. Although the widths W1, W2, W3, and W4 of the trenches 151, 152, 153, and 154 are substantially equal to each other, the mask layer 220 formed over the inner walls N1 and N2 of the trenches 151 and 152 has the trenches 222 and 224 that are narrower than the trenches 151, 152, 153, and 154. Therefore, the formation of the mask layer 220 may narrow the subsequently formed conductive lines by using the mask layer 220 as an etch mask.

Figure 1K:
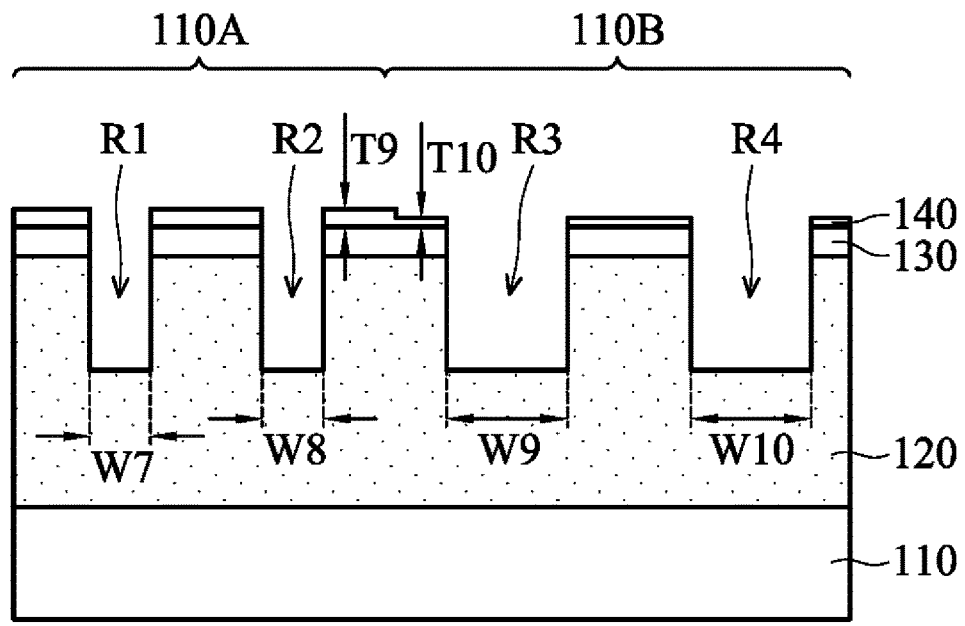

As shown in FIG. 1K, portions of the hard mask layer 140, the mask layer 130, and the dielectric layer 120 under the trenches 222, 224, 153, and 154 are removed to form trenches R1, R2, R3, and R4 in the hard mask layer 140, the mask layer 130, and the dielectric layer 120, in accordance with some embodiments.

The trenches R1, R2, R3, and R4 pass through the hard mask layer 140 and the mask layer 130 and penetrate into the dielectric layer 120, in accordance with some embodiments. The trenches R1, R2, R3, and R4 respectively have widths W7, W8, W9, and W10, in accordance with some embodiments. The width W7 or W8 is less than the width W9 or W10, in accordance with some embodiments.

The removal process includes an etching process using the mask layers 150 and 220 as an etch mask, in accordance with some embodiments. The mask layers 150 and 220 may be consumed during the removal process. In some embodiments, an upper portion of the hard mask layer 140 is consumed during the removal process.

Since the mask layer 220 covers the hard mask layer 140 in the region 110A during the removal process, the hard mask layer 140 remaining in the region 110A is thicker than the hard mask layer 140 remaining in the region 110B. That is, a thickness T9 of the hard mask layer 140 in the region 110A is greater than a thickness T10 of the hard mask layer 140 in the region 110B, in accordance with some embodiments. In some embodiments, the hard mask layer 140 remaining in the region 110A is also referred to as a thick portion, and the hard mask layer 140 remaining in the region 110B is also referred to as a thin portion. In some embodiments, the boundary between the thick portion and the thin portion is substantially aligned with the sidewall 229 of the mask layer 220 (as shown in FIG. 1J).

Figure 1L:
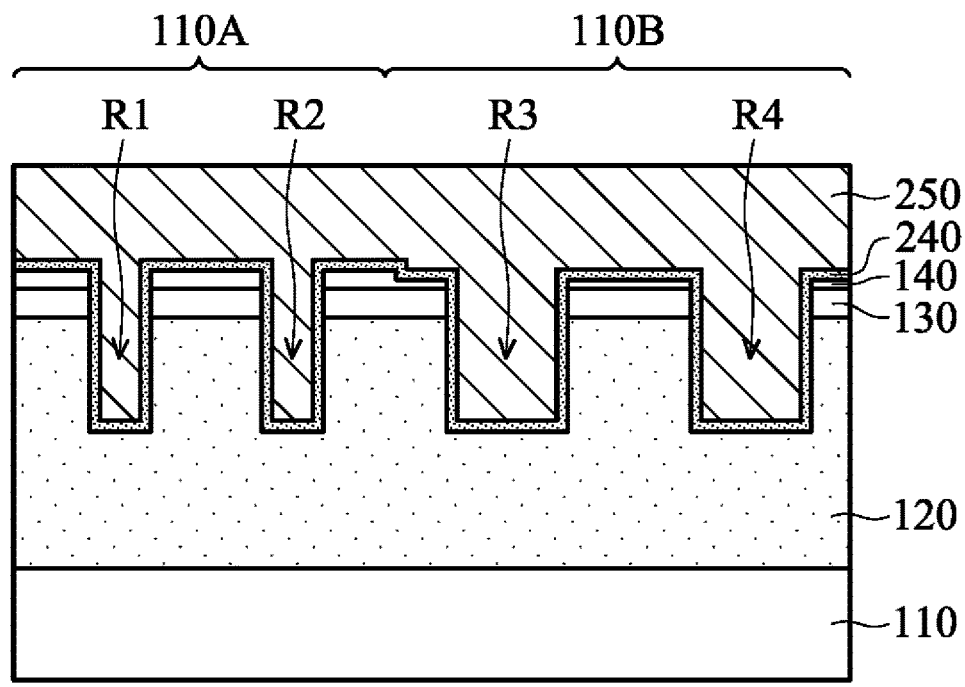

As shown in FIG. 1L, a barrier layer 240 is deposited over the hard mask layer 140, the mask layer 130, and the dielectric layer 120, in accordance with some embodiments. The barrier layer 240 may prevent metal ions of a subsequently deposited conductive material (which will be described in more detail later) from diffusing into the dielectric layer 120 during thermal processes or cycles. The barrier layer 240 may also be referred to as a diffusion barrier layer.

In some embodiments, the barrier layer 240 is made of or includes a refractory metal material, such as tantalum (Ta), titanium (Ti), tantalum nitride, titanium nitride, one or more other suitable materials, or a combination thereof. In some embodiments, the barrier layer 240 is deposited using a PVD process, an ALD process, one or more other applicable processes, or a combination thereof. In some embodiments, the barrier layer 240 is deposited conformally.

As shown in FIG. 1L, a conductive material layer 250 is formed over the barrier layer 240, in accordance with some embodiments. The trenches R1, R2, R3, and R4 are filled with the conductive material layer 250 and the barrier layer 240, in accordance with some embodiments. In some embodiments, the conductive material layer 250 is made of or includes a metal material, such as copper, aluminum, tungsten, titanium, nickel, gold, platinum, silver, one or more other suitable materials, or a combination thereof.

The conductive material layer 250 may be a single layer or have multiple stacked layers. The conductive material layer 250 is deposited using an electroplating process, a PVD process, a CVD process, an electroless plating process, another applicable process, or a combination thereof.

Figure 1M:
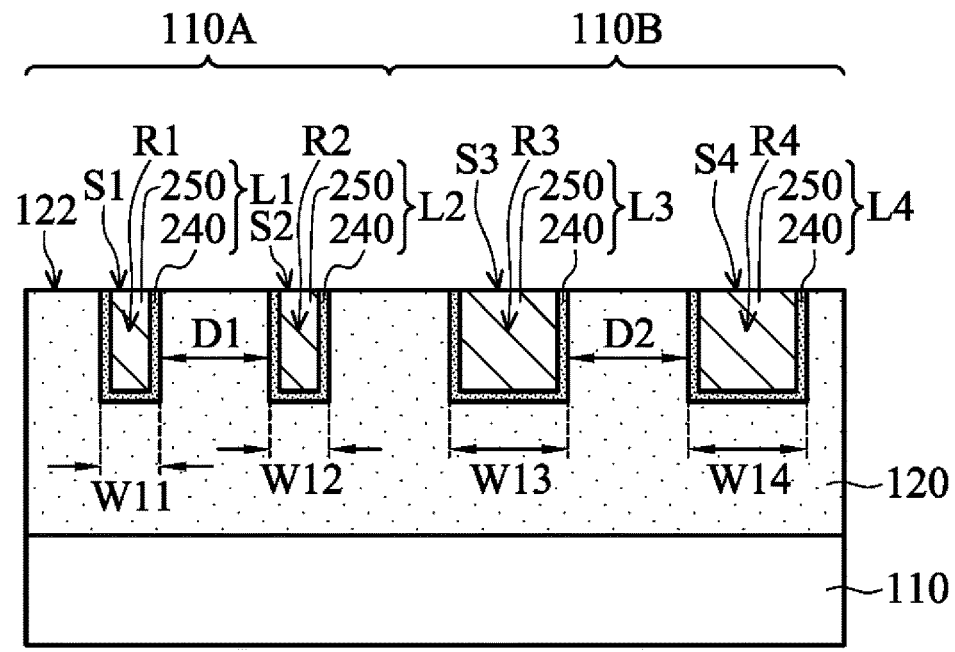

As shown in FIG. 1M, the conductive material layer 250 and the barrier layer 240 outside of the trenches R1, R2, R3, and R4, the hard mask layer 140, and the mask layer 130 are removed, in accordance with some embodiments. The conductive material layer 250 and the barrier layer 240 remaining in the trenches R1, R2, R3, and R4 forms conductive structures L1, L2, L3, and L4 respectively in the trenches R1, R2, R3, and R4, in accordance with some embodiments.

The conductive structures L1, L2, L3, and L4 include conductive lines, in accordance with some embodiments. The conductive structures L1, L2, L3, and L4 respectively have widths (or line widths) W11, W12, W13, and W14, in accordance with some embodiments. Since the width W7 or W8 is less than the width W9 or W10 (as shown in FIG. 1K), the width W11 or W12 is less than the width W13 or W14. The widths W11 and W12 are substantially equal to each other, in accordance with some embodiments. The widths W13 and W14 are substantially equal to each other, in accordance with some embodiments.

The conductive structures L1 and L2 are positioned in the region 110A, and the conductive structures L3 and L4 are positioned in the region 110B, in accordance with some embodiments. The distance D1 between the conductive structures L1 and L2 is less than the distance D2 between the conductive structures L3 and L4, in accordance with some embodiments.

The regions 110A and 110B may be respectively referred to as a small pitch region and a large pitch region. A pitch of a region is equal to a sum of a width of one of conductive structures and a spacing between two adjacent conductive structures in the region. The pitch of the region 110A is equal to a sum of the width W11 (or W12) and the distance D1, in accordance with some embodiments. The pitch of the region 110B is equal to a sum of the width W13 (or W14) and the distance D2, in accordance with some embodiments. Since the width W11 (or W12) is less than the W13 (or W14) and the distance D1 is less than the distance D2, the pitch of the region 110A is less than the pitch of the region 110B.

The removal process includes a planarization process, in accordance with some embodiments. Therefore, top surfaces S1, S2, S3, S4, and 122 of the conductive structures L1, L2, L3, and L4 and the dielectric layer 120 are coplanar, in accordance with some embodiments.

Figure 2A:
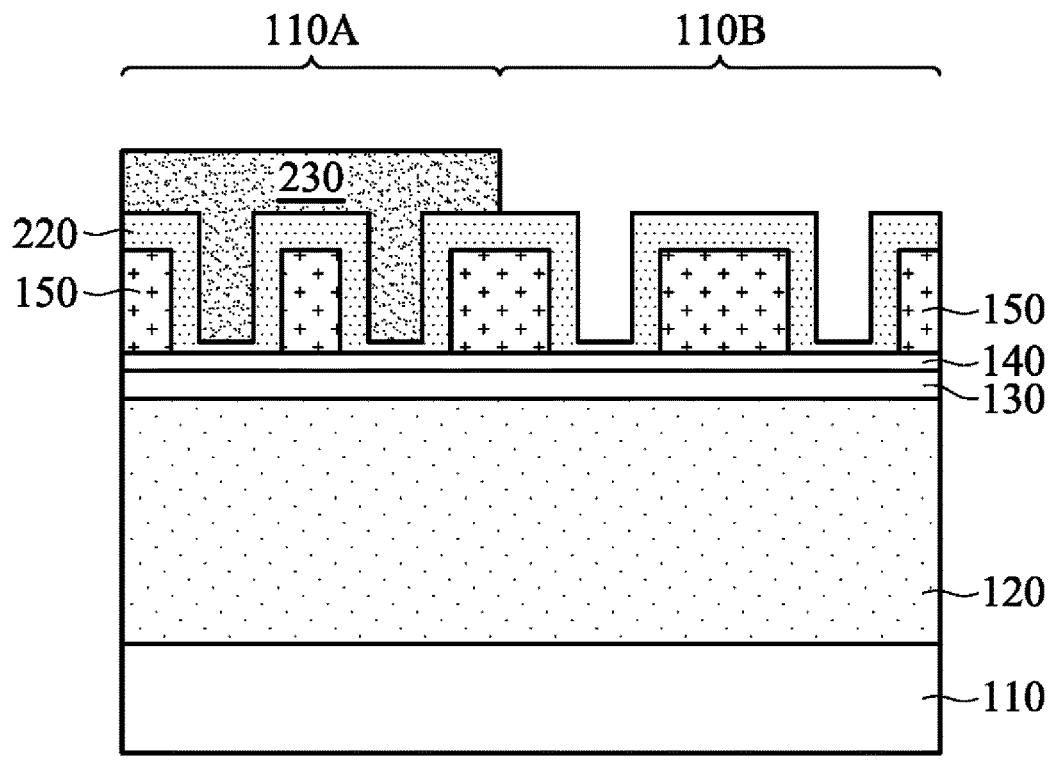
FIGS. 2A-2C are cross-sectional views of various stages of a process for forming a semiconductor device structure, in accordance with some embodiments.
Figure 2B:
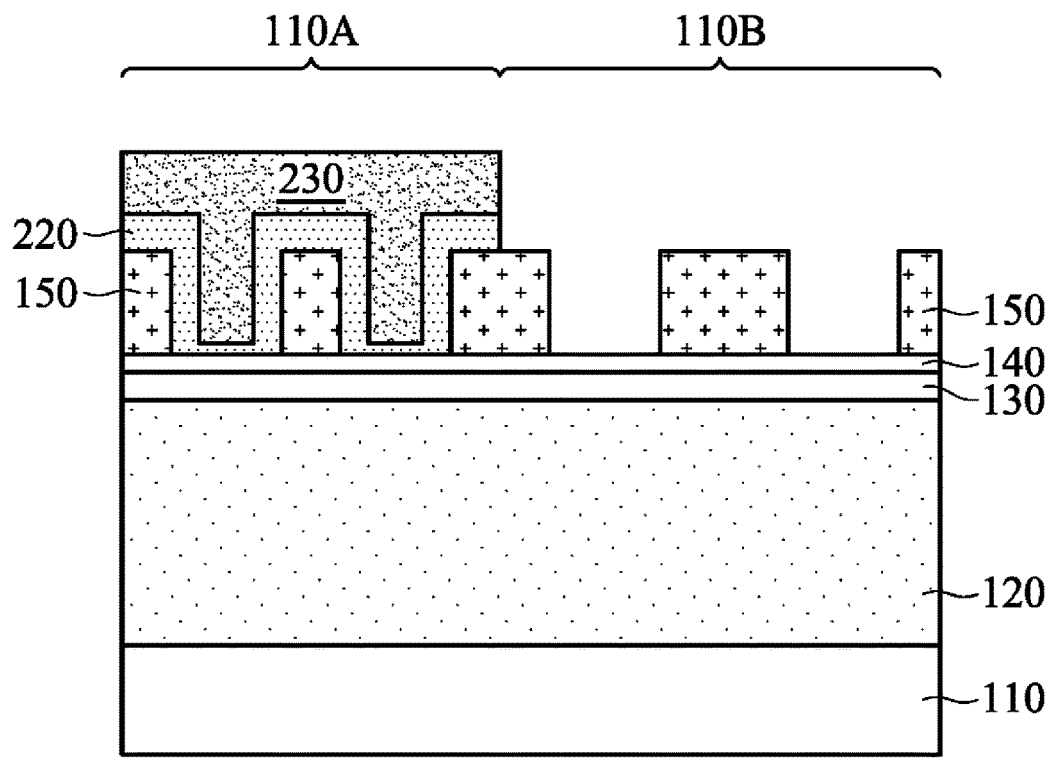
Figure 2C:
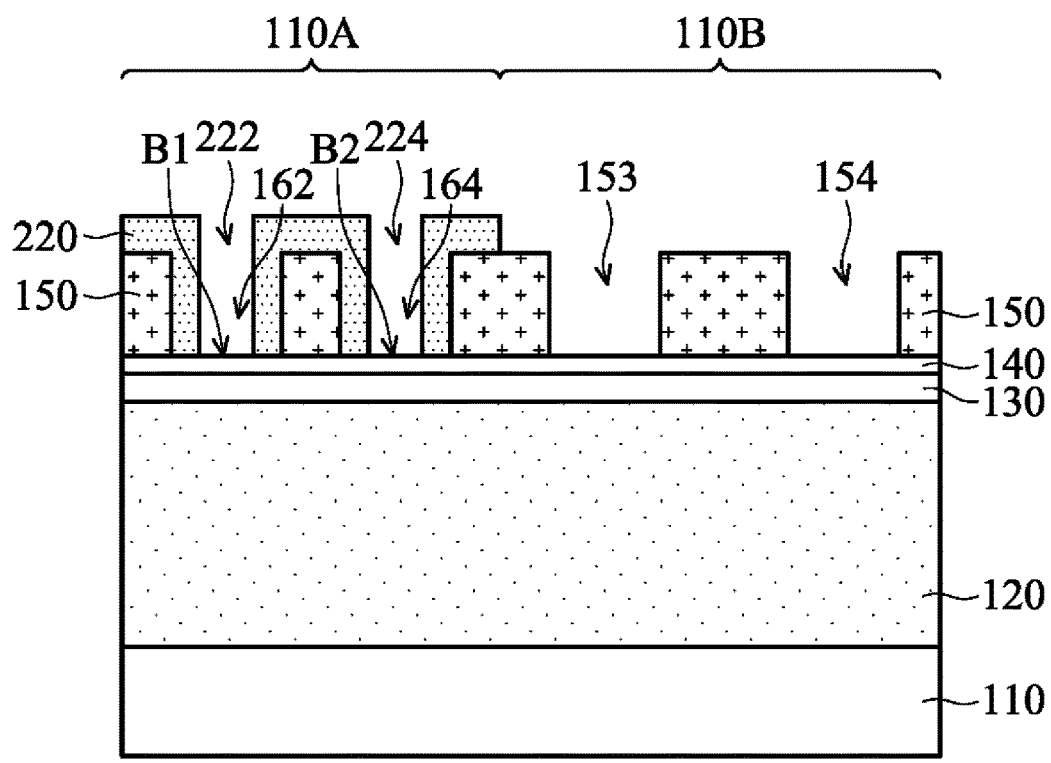

FIGS. 2A-2C are cross-sectional views of various stages of a process for forming a semiconductor device structure, in accordance with some embodiments. The embodiment of FIGS. 2A-2C is similar to the embodiment of FIGS. 1A-1M, except that the embodiment of FIGS. 2A-2C removes the mask layer 220 in the region 110B firstly (as shown in FIG. 2B) and then removes the mask layer 220 covers the bottom surfaces B1 and B2 (as shown in FIG. 2C), in accordance with some embodiments.

After the step of FIG. 1F, as shown in FIG. 2A, a photoresist layer 230 is formed over the mask layer 220 in the region 110A, in accordance with some embodiments. Afterwards, as shown in FIG. 2B, the mask layer 220 in the region 110B is removed, in accordance with some embodiments. The removal process includes an etching process using the photoresist layer 230 as an etch mask, in accordance with some embodiments.

As shown in FIG. 2C, the photoresist layer 230 is removed, in accordance with some embodiments. As shown in FIG. 2C, the mask layer 220 covering the bottom surfaces B1 and B2 is removed to form trenches 222 and 224 in the mask layer 220, in accordance with some embodiments. The trenches 222 and 224 respectively expose the bottom surfaces B1 and B2, in accordance with some embodiments. Afterwards, the steps of FIGS. 1K-1M are performed to form the conductive structures L1, L2, L3, and L4 (as shown in FIG. 1M), in accordance with some embodiments.

Figure 3A:
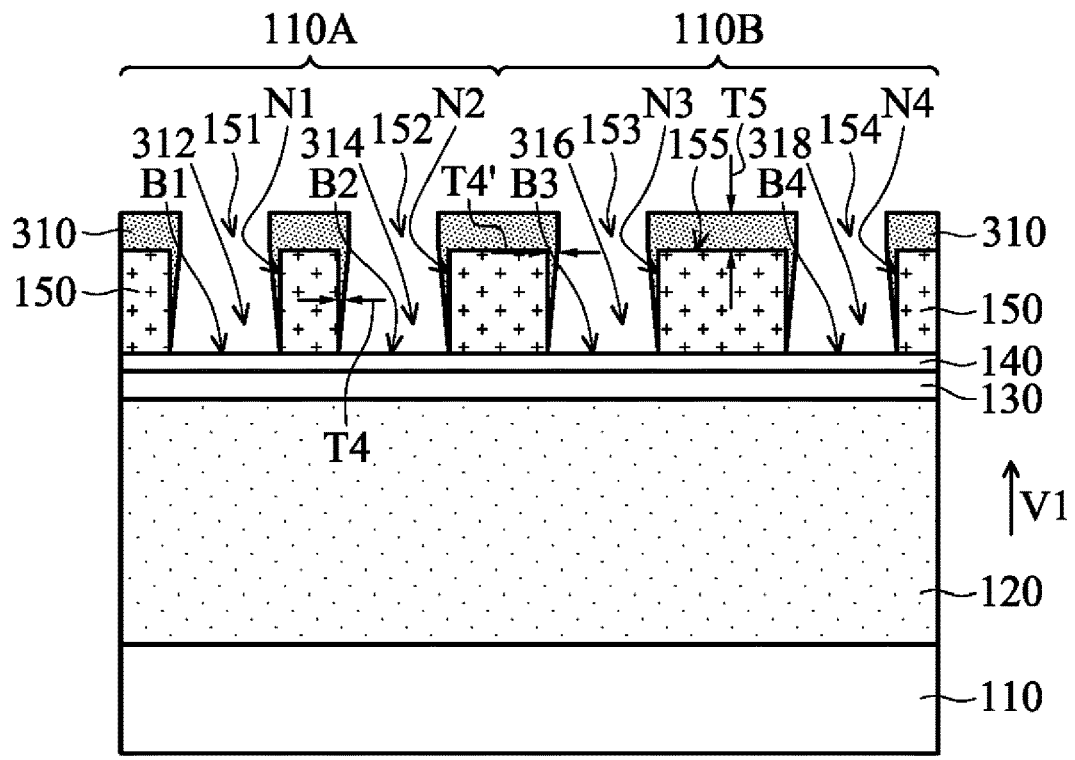
FIGS. 3A-3H are cross-sectional views of various stages of a process for forming a semiconductor device structure, in accordance with some embodiments.

FIGS. 3A-3H are cross-sectional views of various stages of a process for forming a semiconductor device structure, in accordance with some embodiments. After the step of FIG. 1E, as shown in FIG. 3A, a mask layer 310 is formed over the top surface 155 of the mask layer 150 and the inner walls N1, N2, N3, and N4 of the trenches 151, 152, 153, and 154, in accordance with some embodiments.

In some embodiments, a thickness T4 of the mask layer 310 over the inner walls N1, N2, N3, and N4 increases in a direction V1 away from the dielectric layer 120. The mask layer 310 has trenches 312, 314, 316, and 318 respectively in the trenches 151, 152, 153, and 154, in accordance with some embodiments. The trenches 312, 314, 316, and 318 respectively expose the bottom surfaces B1, B2, B3, and B4 of the trenches 151, 152, 153, and 154, in accordance with some embodiments.

The mask layer 310 covering the top surface 155 is thicker than the mask layer 310 covering the inner walls N1, N2, N3, and N4 of the trenches 151, 152, 153, and 154, in accordance with some embodiments. That is, a maximum thickness T5 of the mask layer 310 covering the top surface 155 is greater than a maximum thickness T4' of the mask layer 310 over the inner walls N1, N2, N3, and N4, in accordance with some embodiments.

The mask layer 310 is also referred to as an anti-bombardment layer, in accordance with some embodiments. The mask layer 310 is used to maintain the height of the mask layer 150 thereunder for a longer time during subsequent etching processes (e.g. dry etching processes) for forming trenches in the dielectric layer 120, in accordance with some embodiments.

The mask layer 310 is made of an anti-bombardment material, such as a nitride material (e.g., titanium nitride or tantalum nitride), in accordance with some embodiments. The mask layer 310 is formed using a CVD process or an ALD process, in accordance with some embodiments. The mask layer 310 is deposited at a first deposition pressure, in accordance with some embodiments. The mask layer 310 is deposited with a first deposition power, in accordance with some embodiments.

Figure 3B:
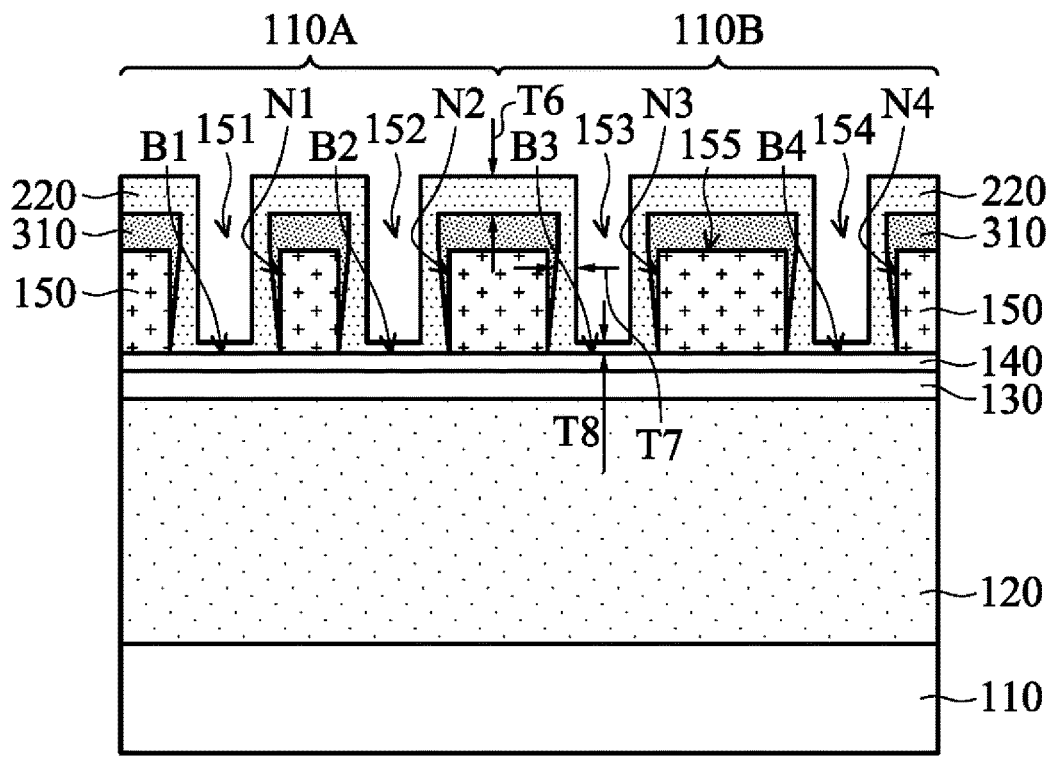

As shown in FIG. 3B, a mask layer 220 is formed over the mask layer 310 and the hard mask layer 140 exposed by the trenches 151, 152, 153, and 154, in accordance with some embodiments. The mask layer 220 covers the inner walls N1, N2, N3, and N4 and the bottom surfaces B1, B2, B3 and B4 of the trenches 151, 152, 153, and 154, in accordance with some embodiments.

The mask layer 220 is also referred to as an anti-chemical etching protective layer, in accordance with some embodiments. The mask layer 220 is used to protect the inner walls N1, N2, N3, and N4 during subsequent etching processes (e.g. dry etching processes) for forming trenches in the dielectric layer 120, in accordance with some embodiments. The mask layer 220 is in direct contact with the mask layers 150 and 310 and the hard mask layer 140, in accordance with some embodiments.

In some embodiments, a first thickness T6 of the mask layer 220 over the top surface 155 is greater than a second thickness T7 of the mask layer 220 over the inner walls N1, N2, N3, and N4. The second thickness T7 is greater than a third thickness T8 of the mask layer 220 over the bottom surfaces B1, B2, B3 and B4, in accordance with some embodiments.

The mask layers 220 and 310 are made of different materials, in accordance with some embodiments. The mask layer 220 is made of or includes an anti-chemical etching material, such as a nitride material (e.g. SiON, SiCN, SiN) or a low temperature oxide material (e.g., silicon dioxide), in accordance with some embodiments. The mask layer 220 is deposited using a CVD process, an ALD process, one or more other applicable processes, or a combination thereof.

The mask layer 220 is deposited at a second deposition pressure, in accordance with some embodiments. The mask layer 220 is deposited with a second deposition power, in accordance with some embodiments. If the deposition pressure is high and the deposition power is low, the deposited layer tends to be deposited outside of the trenches. If the deposition pressure is low and the deposition power is large, the deposited layer tends to be deposited in the trenches. Therefore, the first deposition pressure is greater than the second deposition pressure, in accordance with some embodiments. The first deposition power is less than the second deposition power, in accordance with some embodiments.

Figure 3C:
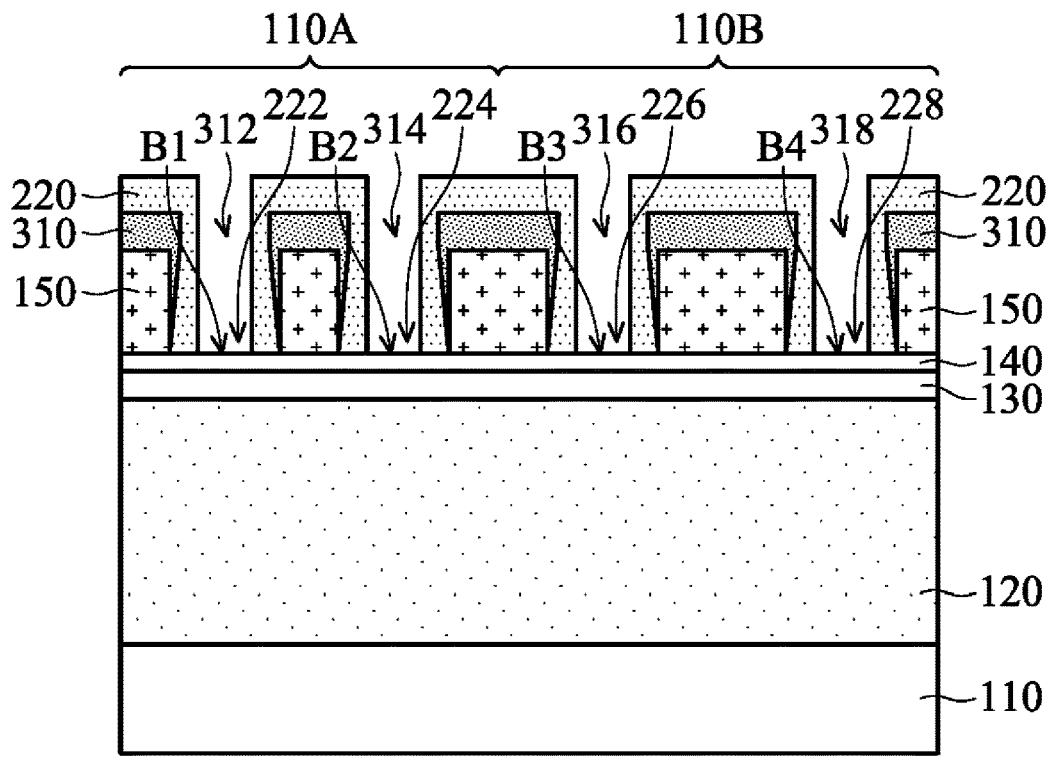

As shown in FIG. 3C, the mask layer 220 over the bottom surfaces B1, B2, B3 and B4 is removed, in accordance with some embodiments. The removal process forms trenches 222, 224, 226, and 228 in the mask layer 220, in accordance with some embodiments. The trenches 222, 224, 226, and 228 are respectively positioned in the trenches 312, 314, 316, and 318, in accordance with some embodiments. The trenches 222, 224, 226, and 228 respectively expose the bottom surfaces B1, B2, B3 and B4, in accordance with some embodiments. The removal process includes an etching process, such a dry etching process or a wet etching process, in accordance with some embodiments.

Figure 3D:
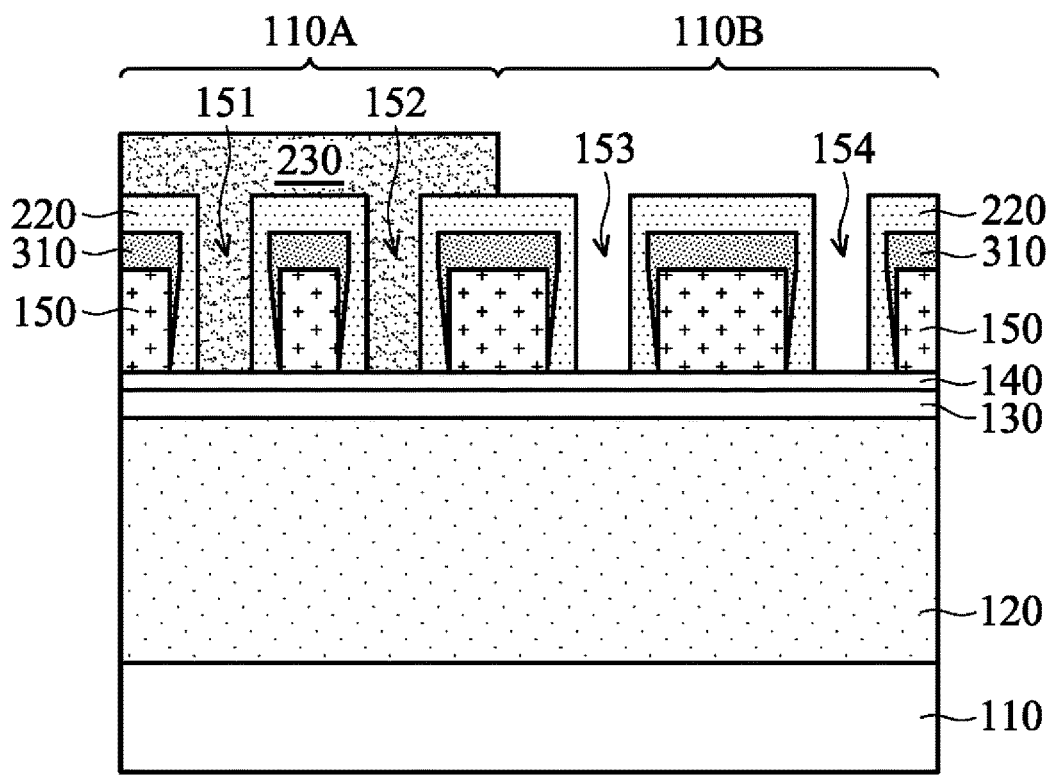
Figure 3E:
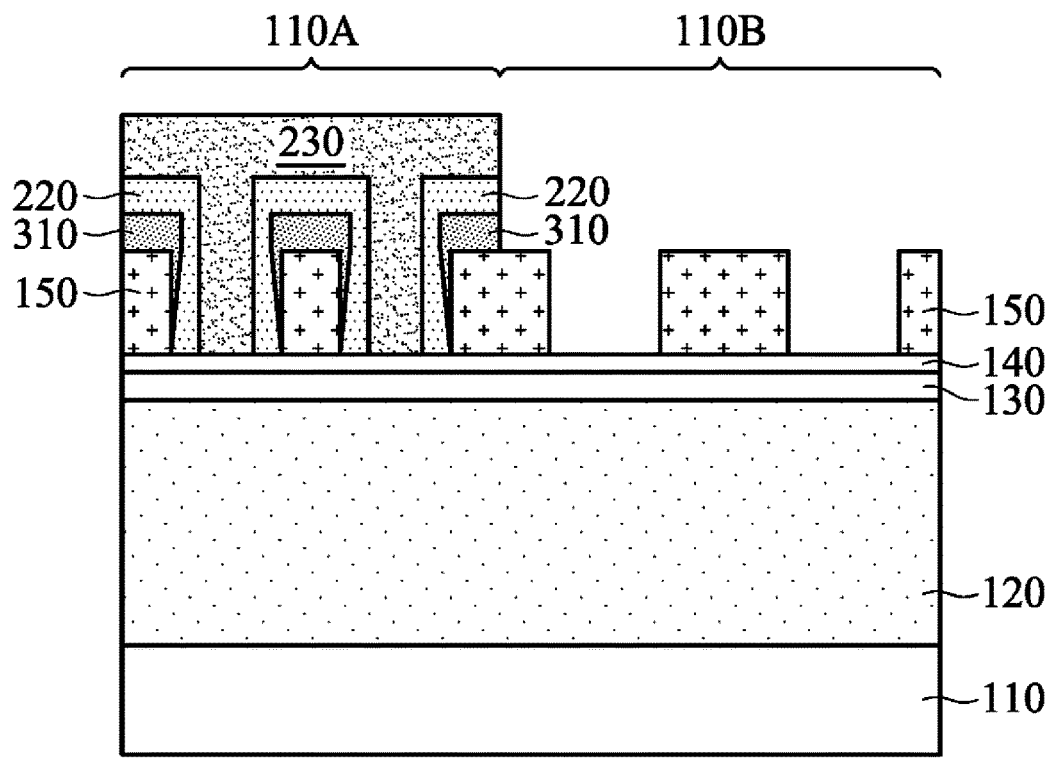

As shown in FIG. 3D, a photoresist layer 230 is formed over the mask layer 220 in the region 110A, in accordance with some embodiments. The photoresist layer 230 is filled in the trenches 151 and 152, in accordance with some embodiments. As shown in FIG. 3E, the mask layers 220 and 310 in the region 110B are removed, in accordance with some embodiments. The removal process includes an etching process, such as a dry etching process, in accordance with some embodiments.

Figure 3F:
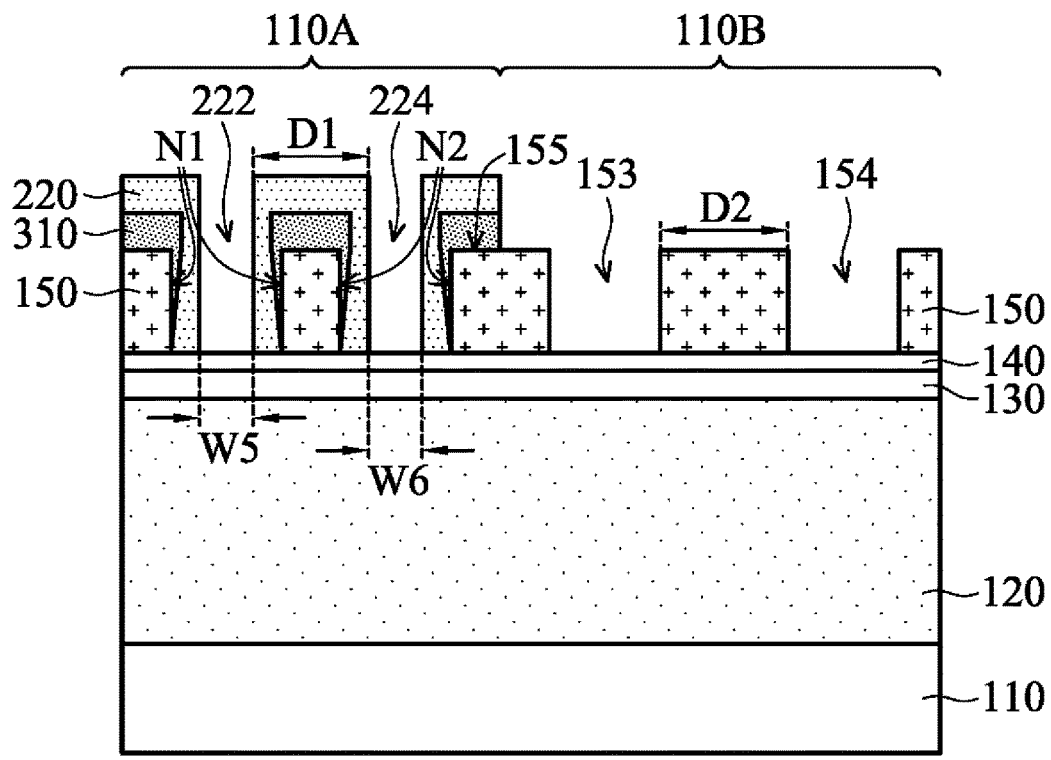

As shown in FIG. 3F, the photoresist layer 230 is removed, in accordance with some embodiments. In some embodiments, a distance D1 between the trenches 222 and 224 is less than a distance D2 between the trenches 153 and 154. The mask layers 150, 220, and 310 are used as an etch mask in subsequent processes for forming conductive lines, in accordance with some embodiments.

Figure 3G:
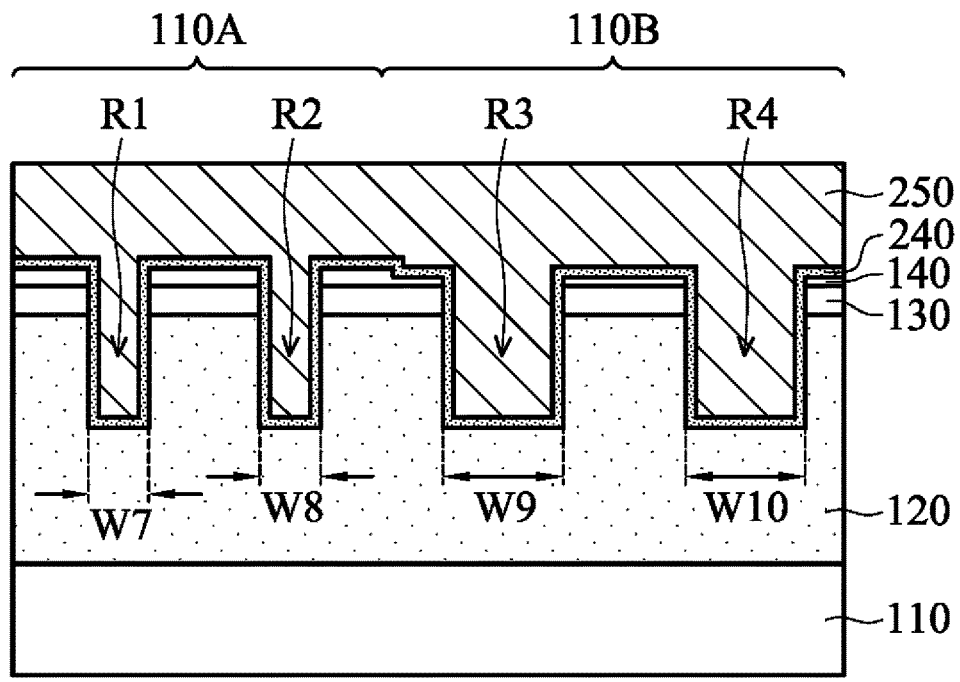

As shown in FIG. 3G, portions of the hard mask layer 140, the mask layer 130, and the dielectric layer 120 under the trenches 222, 224, 153, and 154 are removed to form trenches R1, R2, R3, and R4 in the hard mask layer 140, the mask layer 130, and the dielectric layer 120, in accordance with some embodiments.

The trenches R1, R2, R3, and R4 pass through the hard mask layer 140 and the mask layer 130 and penetrate into the dielectric layer 120, in accordance with some embodiments. The trenches R1, R2, R3, and R4 respectively have widths W7, W8, W9, and W10, in accordance with some embodiments. The width W7 or W8 is less than the width W9 or W10, in accordance with some embodiments.

The removal process includes an etching process using the mask layers 150, 220, and 310 as an etch mask, in accordance with some embodiments. The mask layers 150, 220, and 310 may be consumed during the removal process. In some embodiments, an upper portion of the hard mask layer 140 is consumed during the removal process.

Since the mask layer (or the anti-bombardment layer) 310 covers the top surface 155 of the mask layer 150, the height of the mask layer 150 is maintained for a longer time during the removal process, as shown in FIGS. 3F and 3G, in accordance with some embodiments. Since the mask layer 220 is made of an anti-chemical etching material, the widths W5 and W6 of the trenches 222 and 224 of the mask layer 220 are maintained for a longer time during the removal process, as shown in FIGS. 3F and 3G, in accordance with some embodiments. Therefore, the formation of the mask layers 220 and 310 may improve the yield of the trenches R1 and R2, as shown in FIGS. 3F and 3G.

As shown in FIG. 3G, a barrier layer 240 is deposited over the hard mask layer 140, the mask layer 130, and the dielectric layer 120, in accordance with some embodiments. The barrier layer 240 may prevent metal ions of a subsequently deposited conductive material (which will be described in more detail later) from diffusing into the dielectric layer 120 during thermal processes or cycles. The barrier layer 240 may also be referred to as a diffusion barrier layer.

In some embodiments, the barrier layer 240 is made of or includes a refractory metal material, such as tantalum (Ta), titanium (Ti), tantalum nitride, titanium nitride, one or more other suitable materials, or a combination thereof. In some embodiments, the barrier layer 240 is deposited using a PVD process, an ALD process, one or more other applicable processes, or a combination thereof. In some embodiments, the barrier layer 240 is deposited conformally.

As shown in FIG. 3G, a conductive material layer 250 is formed over the barrier layer 240, in accordance with some embodiments. The trenches R1, R2, R3, and R4 are filled with the conductive material layer 250 and the barrier layer 240, in accordance with some embodiments.

Figure 3H:
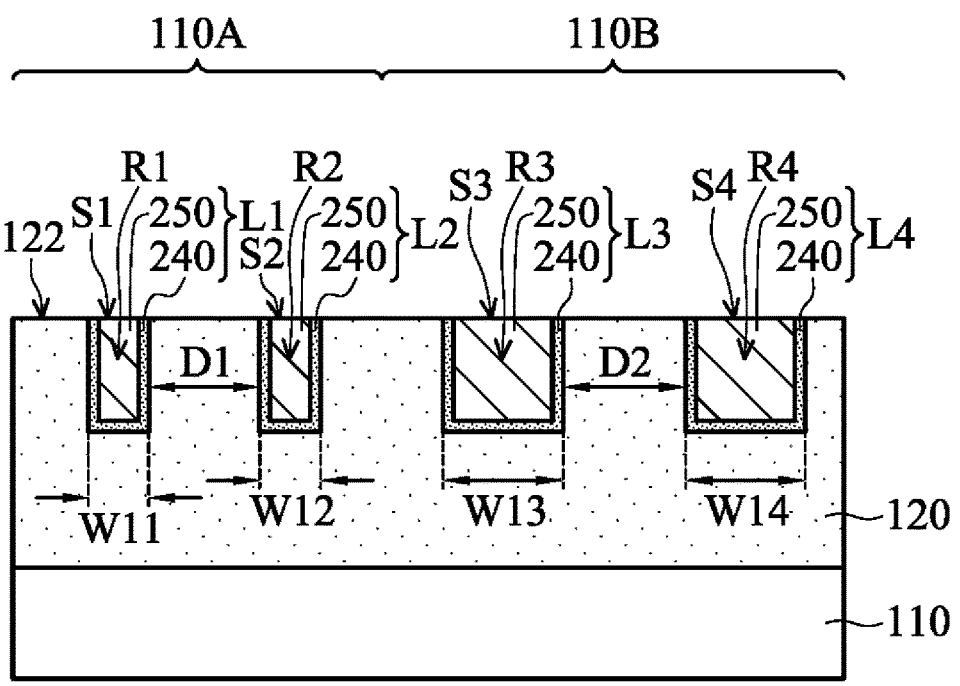

As shown in FIG. 3H, the conductive material layer 250 and the barrier layer 240 outside of the trenches R1, R2, R3, and R4, the hard mask layer 140, and the mask layer 130 are removed, in accordance with some embodiments. The conductive material layer 250 and the barrier layer 240 remaining in the trenches R1, R2, R3, and R4 forms conductive structures L1, L2, L3, and L4 respectively in the trenches R1, R2, R3, and R4, in accordance with some embodiments.

The conductive structures L1, L2, L3, and L4 include conductive lines, in accordance with some embodiments. The conductive structures L1, L2, L3, and L4 respectively have widths (or line widths) W11, W12, W13, and W14, in accordance with some embodiments. Since the width W7 or W8 is less than the width W9 or W10 (as shown in FIG. 3G), the width W11 or W12 is less than the width W13 or W14.

The conductive structures L1 and L2 are positioned in the region 110A, and the conductive structures L3 and L4 are positioned in the region 110B, in accordance with some embodiments. The distance D1 between the conductive structures L1 and L2 is less than the distance D2 between the conductive structures L3 and L4, in accordance with some embodiments.

The removal process includes a planarization process, in accordance with some embodiments. Therefore, top surfaces S1, S2, S3, S4, and 122 of the conductive structures L1, L2, L3, and L4 and the dielectric layer 120 are coplanar, in accordance with some embodiments.

Figure 4A:
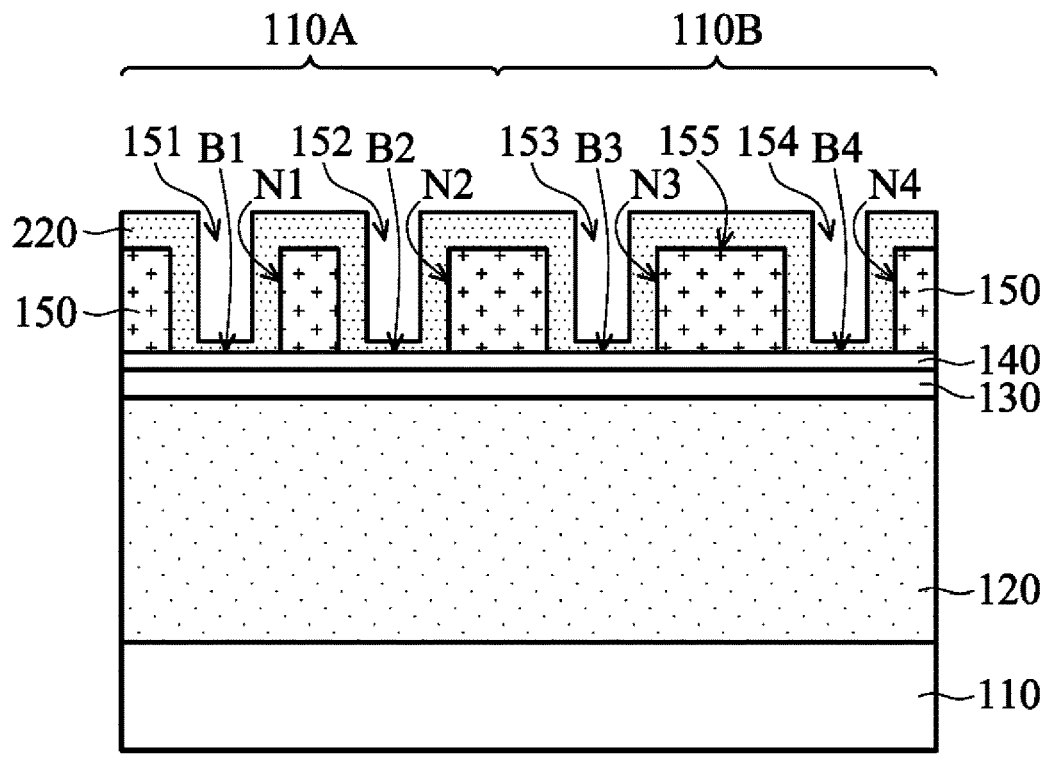
FIGS. 4A-4F are cross-sectional views of various stages of a process for forming a semiconductor device structure, in accordance with some embodiments.

FIGS. 4A-4F are cross-sectional views of various stages of a process for forming a semiconductor device structure, in accordance with some embodiments. After the step of FIG. 1E, as shown in FIG. 4A, a mask layer 220 is conformally formed over the top surface 155 of the mask layer 150, the inner walls N1, N2, N3, and N4, and the bottom surfaces B1, B2, B3, and B4 of the trenches 151, 152, 153, and 154, in accordance with some embodiments. The mask layer 220 is made of or includes an anti-chemical etching material, such as a nitride material (e.g, SiON, SiCN, or SiN) or a low temperature oxide material (e.g., silicon dioxide), in accordance with some embodiments.

Figure 4B:
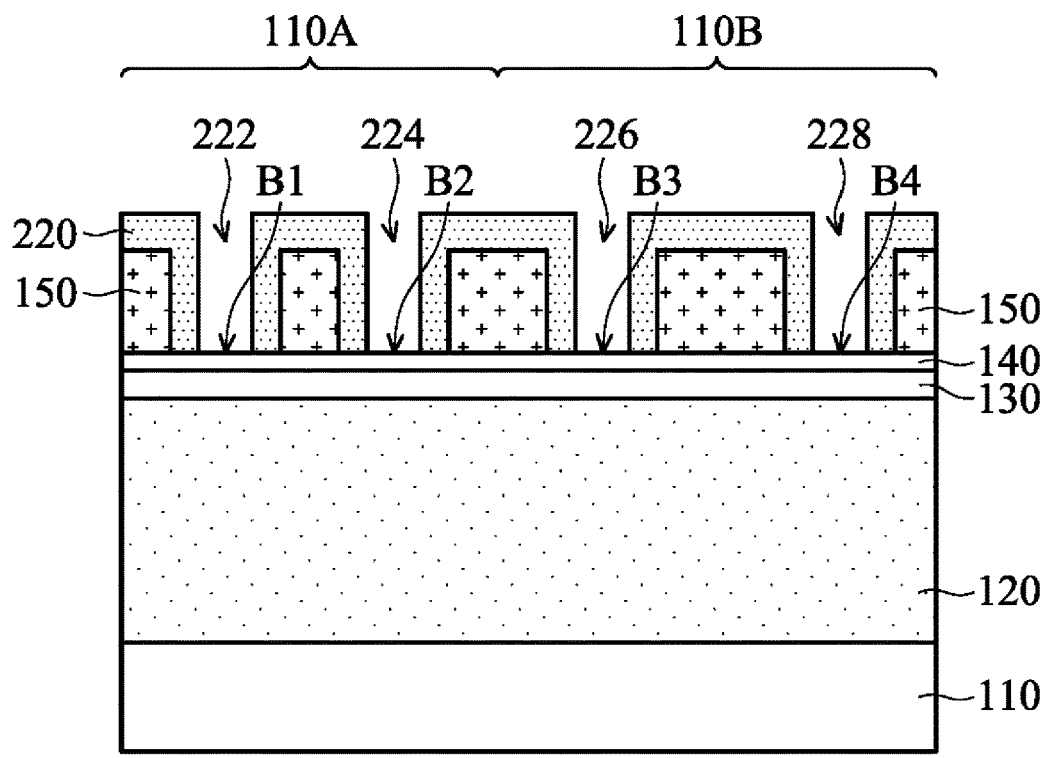
Figure 4C:
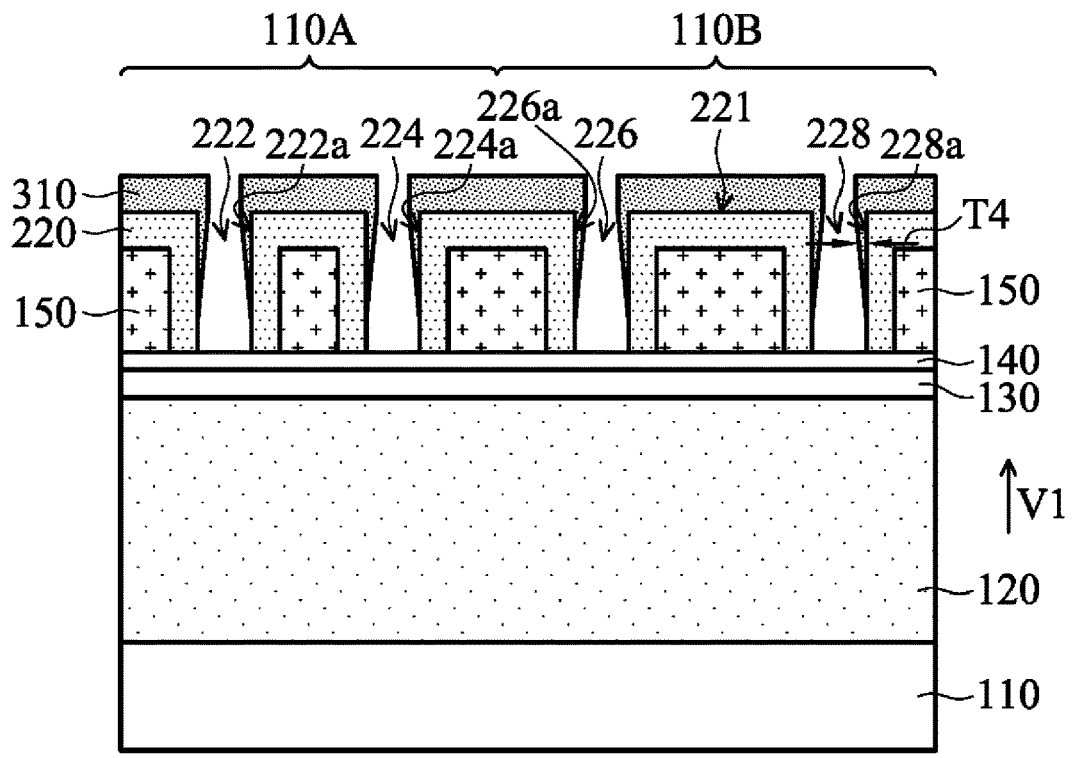

As shown in FIG. 4B, the mask layer 220 over the bottom surfaces B1, B2, B3, and B4 is removed, in accordance with some embodiments. The mask layer 220 has trenches 222, 224, 226, and 228, in accordance with some embodiments. As shown in FIG. 4C, a mask layer 310 is formed over the mask layer 220, in accordance with some embodiments.

The mask layer 310 covers a top surface 221 of the mask layer 220 and inner walls 222a, 224a, 226a, and 228a of the trenches 222, 224, 226, and 228, in accordance with some embodiments. In some embodiments, a thickness T4 of the mask layer 310 over the inner walls 222a, 224a, 226a, and 228a increases in a direction V1 away from the dielectric layer 120. The mask layer 310 is made of an anti-bombardment material, such as a nitride material (e.g., titanium nitride or tantalum nitride), in accordance with some embodiments. The mask layers 220 and 310 are made of different materials, in accordance with some embodiments.

Figure 4D:
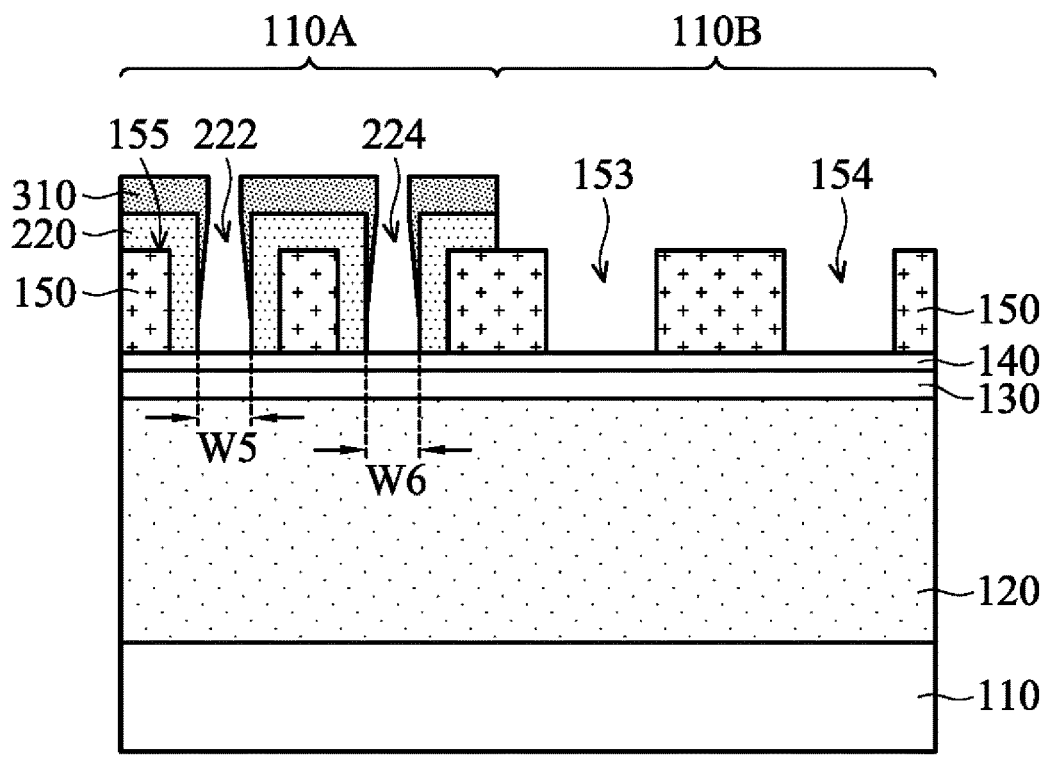
Figure 4E:
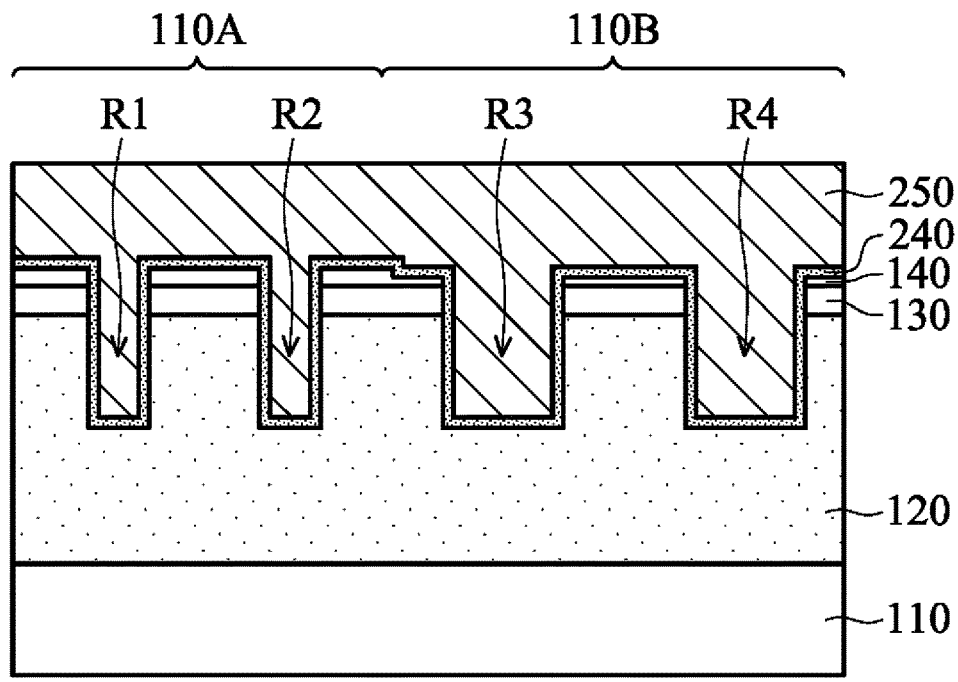

As shown in FIG. 4D, the mask layers 220 and 310 in the region 110B are removed, in accordance with some embodiments. As shown in FIG. 4E, portions of the hard mask layer 140, the mask layer 130, and the dielectric layer 120 under the trenches 222, 224, 153, and 154 are removed to form trenches R1, R2, R3, and R4 in the hard mask layer 140, the mask layer 130, and the dielectric layer 120, in accordance with some embodiments.

The trenches R1, R2, R3, and R4 pass through the hard mask layer 140 and the mask layer 130 and penetrate into the dielectric layer 120, in accordance with some embodiments. The removal process includes an etching process using the mask layers 150, 220, and 310 as an etch mask, in accordance with some embodiments. The mask layers 150, 220, and 310 may be consumed during the removal process. In some embodiments, an upper portion of the hard mask layer 140 is consumed during the removal process.

Since the mask layer (or the anti-bombardment layer) 310 covers the top surface 155 of the mask layer 150, the height of the mask layer 150 is maintained for a longer time during the removal process, as shown in FIGS. 4D and 4E, in accordance with some embodiments. Since the mask layer 220 is made of an anti-chemical etching material, the widths W5 and W6 of the trenches 222 and 224 of the mask layer 220 are maintained for a longer time during the removal process, as shown in FIGS. 4D and 4E, in accordance with some embodiments. Therefore, the formation of the mask layers 220 and 310 may improve the yield of the trenches R1 and R2, as shown in FIGS. 4D and 4E.

As shown in FIG. 4E, a barrier layer 240 is deposited over the hard mask layer 140, the mask layer 130, and the dielectric layer 120, in accordance with some embodiments. As shown in FIG. 4E, a conductive material layer 250 is formed over the barrier layer 240, in accordance with some embodiments.

Figure 4F:
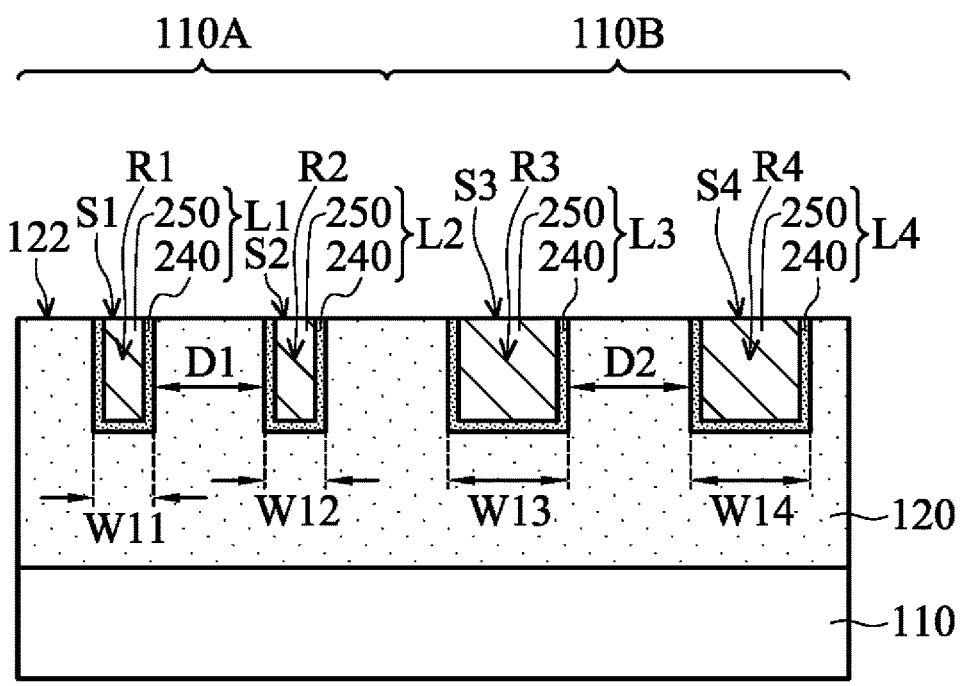

As shown in FIG. 4F, the conductive material layer 250 and the barrier layer 240 outside of the trenches R1, R2, R3, and R4, the hard mask layer 140, and the mask layer 130 are removed, in accordance with some embodiments. The conductive material layer 250 and the barrier layer 240 remaining in the trenches R1, R2, R3, and R4 forms conductive structures L1, L2, L3, and L4 respectively in the trenches R1, R2, R3, and R4, in accordance with some embodiments.

The conductive structures L1, L2, L3, and L4 include conductive lines, in accordance with some embodiments. The conductive structures L1, L2, L3, and L4 respectively have widths (or line widths) W11, W12, W13, and W14, in accordance with some embodiments. The width W11 or W12 is less than the width W13 or W14, in accordance with some embodiments. The distance D1 between the conductive structures L1 and L2 is less than the distance D2 between the conductive structures L3 and L4, in accordance with some embodiments.

The removal process includes a planarization process, in accordance with some embodiments. Therefore, top surfaces S1, S2, S3, S4, and 122 of the conductive structures L1, L2, L3, and L4 and the dielectric layer 120 are coplanar, in accordance with some embodiments.

In accordance with some embodiments, methods for forming semiconductor device structures are provided. The methods (for forming the semiconductor device structure) include: forming a first mask layer over a dielectric layer; conformally forming a second mask layer over an inner wall of a first trench of the first mask layer; and removing the dielectric layer through the first trench to form a second trench in the dielectric layer. The formation of the second mask layer over the inner wall is able to narrow the second trench.

In accordance with some embodiments, a method for forming a semiconductor device structure is provided. The method includes forming a first mask layer over a dielectric layer. The first mask layer has a first trench, and the first trench has an inner wall and a bottom surface. The method includes forming a second mask layer over a first top surface of the first mask layer, the inner wall, and the bottom surface. The method includes removing the second mask layer covering the bottom surface to form a second trench in the second mask layer. The second trench exposes the bottom surface and is over a first portion of the dielectric layer. The method includes forming an anti-bombardment layer over a second top surface of the second mask layer. The second mask layer and the anti-bombardment layer are made of different materials. The method includes removing the first portion, the first mask layer, the second mask layer, and the anti-bombardment layer to form a third trench in the dielectric layer. The method includes forming a conductive structure in the third trench.

In accordance with some embodiments, a method for forming a semiconductor device structure is provided. The method includes forming a first mask layer over a dielectric layer. The first mask layer has a first trench and a second trench, and the first trench has a first inner wall and a first bottom surface. The method includes forming a second mask layer over the first inner wall. The second mask layer has a third trench in the first trench and exposing the first bottom surface, the third trench is narrower than the second trench, and the third trench and the second trench are respectively over a first portion and a second portion of the dielectric layer. The method includes. The method includes forming an anti-bombardment layer over a first top surface of the first mask layer and a second top surface of the second mask layer. The second mask layer and the anti-bombardment layer are made of different materials. The method includes removing the first portion, the second portion, the first mask layer, the second mask layer, and the anti-bombardment layer to form a fourth trench and a fifth trench in the dielectric layer. The fourth trench is narrower than the fifth trench. The method includes forming a first conductive structure and a second conductive structure respectively in the fourth trench and the fifth trench.

In accordance with some embodiments, a method for forming a semiconductor device structure is provided. The method includes forming a first mask layer over a dielectric layer. The first mask layer has a first trench and a second trench, and the first trench has an inner wall and a bottom surface. The method includes forming a second mask layer over a first portion of a top surface of the first mask layer and the inner wall. The second mask layer exposes a second portion of the top surface, the first portion and the second portion are respectively adjacent to the first trench and the second trench, the second mask layer has a third trench in the first trench and exposing the bottom surface, and the third trench and the second trench are respectively over a third portion and a fourth portion of the dielectric layer. The method includes removing the third portion, the fourth portion, the first mask layer, and the second mask layer to form a fourth trench and a fifth trench in the dielectric layer. The fourth trench is narrower than the fifth trench. The method includes forming a first conductive structure and a second conductive structure respectively in the fourth trench and the fifth trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
    forming a first mask layer over a dielectric layer, wherein the first mask layer has a first trench, and the first trench has an inner wall and a bottom surface;
    forming a second mask layer over a first top surface of the first mask layer, the inner wall, and the bottom surface;
    removing the second mask layer covering the bottom surface to form a second trench in the second mask layer, wherein the second trench exposes the bottom surface and is over a first portion of the dielectric layer;
    forming an anti-bombardment layer over a second top surface of the second mask layer, wherein the second mask layer and the anti-bombardment layer are made of different materials;
    removing the first portion, the first mask layer, the second mask layer, and the anti-bombardment layer to form a third trench in the dielectric layer; and
    forming a conductive structure in the third trench.

2. The method for forming the semiconductor device structure as claimed in claim 1, wherein the anti-bombardment layer covers a sidewall of the second mask layer.

3. The method for forming the semiconductor device structure as claimed in claim 2, wherein the anti-bombardment layer covers an upper portion of the sidewall and exposes a lower portion of the sidewall.

4. The method for forming the semiconductor device structure as claimed in claim 2, wherein the anti-bombardment layer and the first mask layer are made of different materials.

5. The method for forming the semiconductor device structure as claimed in claim 2, wherein the anti-bombardment layer over the second top surface of the second mask layer is thicker than the anti-bombardment layer over the sidewall of the second mask layer.

6. The method for forming the semiconductor device structure as claimed in claim 1, wherein the anti-bombardment layer has a fourth trench exposing the bottom surface and is over the first portion of the dielectric layer.

7. The method for forming the semiconductor device structure as claimed in claim 6, wherein the removing of the first portion of the dielectric layer comprises:
    removing the first portion through the second trench of the second mask layer and the fourth trench of the anti-bombardment layer.

8. The method for forming the semiconductor device structure as claimed in claim 1, wherein the second mask layer over the first top surface of the first mask layer is thicker than the second mask layer over the inner wall, and the second mask layer over the inner wall is thicker than the second mask layer over the bottom surface.

9. The method for forming the semiconductor device structure as claimed in claim 1, wherein the first mask layer and the second mask layer are made of a same material.

10. The method for forming the semiconductor device structure as claimed in claim 9, wherein the dielectric layer and the first mask layer are made of different materials.

11. A method for forming a semiconductor device structure, comprising:
    forming a first mask layer over a dielectric layer, wherein the first mask layer has a first trench and a second trench, and the first trench has a first inner wall and a first bottom surface;
    forming a second mask layer over the first inner wall, wherein the second mask layer has a third trench in the first trench and exposing the first bottom surface, the third trench is narrower than the second trench, and the third trench and the second trench are respectively over a first portion and a second portion of the dielectric layer;
    forming an anti-bombardment layer over a first top surface of the first mask layer and a second top surface of the second mask layer, wherein the second mask layer and the anti-bombardment layer are made of different materials;
    removing the first portion, the second portion, the first mask layer, the second mask layer, and the anti-bombardment layer to form a fourth trench and a fifth trench in the dielectric layer, wherein the fourth trench is narrower than the fifth trench; and
    forming a first conductive structure and a second conductive structure respectively in the fourth trench and the fifth trench.

12. The method for forming the semiconductor device structure as claimed in claim 11, further comprising:
    before forming the first mask layer, forming a third mask layer over the dielectric layer,
    wherein the first mask layer is formed over the third mask layer, the second trench and the third trench respectively expose a third portion and a fourth portion of the third mask layer, and
    wherein the removing of the first portion, the second portion, the first mask layer, the second mask layer, and the anti-bombardment layer further comprises:
    removing the third portion and the fourth portion.

13. The method for forming the semiconductor device structure as claimed in claim 12, wherein the forming of the first conductive structure and the second conductive structure comprises:
    after removing the first portion, the second portion, the third portion, the fourth portion, the first mask layer, the second mask layer, and the anti-bombardment layer, forming a conductive material layer over the third mask layer and the dielectric layer, wherein the fourth trench and the fifth trench are filled with the conductive material layer; and removing the third mask layer and the conductive material layer outside of the fourth trench and the fifth trench.

14. The method for forming the semiconductor device structure as claimed in claim 12, wherein the third mask layer and the first mask layer are made of different materials.

15. The method for forming the semiconductor device structure as claimed in claim 12, wherein the third mask layer has a fifth portion and a sixth portion, the fifth portion is covered by the second mask layer, the sixth portion is covered by the first mask layer and is not covered by the second mask layer, and the sixth portion is thinner than the fifth portion after removing the first portion, the second portion, the first mask layer, the second mask layer, and the anti-bombardment layer.

16. A method for forming a semiconductor device structure, comprising:
    forming a first mask layer over a dielectric layer, wherein the first mask layer has a first trench and a second trench, and the first trench has an inner wall and a bottom surface;
    forming a second mask layer over a first portion of a top surface of the first mask layer and the inner wall, wherein the second mask layer exposes a second portion of the top surface, the first portion and the second portion are respectively adjacent to the first trench and the second trench, the second mask layer has a third trench in the first trench and exposing the bottom surface, and the third trench and the second trench are respectively over a third portion and a fourth portion of the dielectric layer;
    removing the third portion, the fourth portion, the first mask layer, and the second mask layer to form a fourth trench and a fifth trench in the dielectric layer, wherein the fourth trench is narrower than the fifth trench; and
    forming a first conductive structure and a second conductive structure respectively in the fourth trench and the fifth trench.

17. The method for forming the semiconductor device structure as claimed in claim 16, wherein a thickness of the second mask layer over the inner wall increases in a direction away from the dielectric layer.

18. The method for forming the semiconductor device structure as claimed in claim 17, wherein the second mask layer covering the first portion of the top surface is thicker than the second mask layer covering the inner wall.

19. The method for forming the semiconductor device structure as claimed in claim 16, further comprising:
    before the forming of the second mask layer over the first portion of the top surface of the first mask layer and the inner wall, conformally forming a third mask layer over the top surface and the inner wall, the second mask layer is formed over the third mask layer, and
    the removing of the third portion, the fourth portion, the first mask layer, and the second mask layer further comprises removing the third mask layer.

20. The method for forming the semiconductor device structure as claimed in claim 19, wherein the second mask layer and the third mask layer are made of different materials.

* * * * *